(12) United States Patent
Hillis et al.

(10) Patent No.: US 7,662,008 B2
(45) Date of Patent: Feb. 16, 2010

(54) METHOD OF ASSEMBLING DISPLAYS ON SUBSTRATES

(75) Inventors: W. Daniel Hillis, Encino, CA (US); Nathan P. Myhrvold, Medina, WA (US); Clarence T. Tegreene, Bellevue, WA (US); Victoria Y. H. Wood, Livermore, CA (US); Lowell L. Wood, Jr., Livermore, CA (US)

(73) Assignee: Searete LLC, Bellevue, WA (US)

( * ) Notice: Subject to any disclaimer, the term of this patent is extended or adjusted under 35 U.S.C. 154(b) by 633 days.

(21) Appl. No.: 11/099,682

(22) Filed: Apr. 4, 2005

(65) Prior Publication Data

US 2006/0220989 A1    Oct. 5, 2006

(51) Int. Cl.
*H01J 9/00*     (2006.01)

(52) U.S. Cl. .......................................... 445/24; 445/23

(58) Field of Classification Search ................. 445/24; 349/45
See application file for complete search history.

(56) References Cited

U.S. PATENT DOCUMENTS

| | | | |
|---|---|---|---|
| 4,843,191 A * | 6/1989 | Thomas .................... | 174/88 R |
| 5,298,892 A | 3/1994 | Shapiro et al. | |
| 5,355,577 A | 10/1994 | Cohn | |
| 5,371,618 A | 12/1994 | Tai et al. | |
| 5,545,291 A * | 8/1996 | Smith et al. ................. | 438/107 |
| 5,596,434 A | 1/1997 | Walba et al. | |
| 5,904,545 A * | 5/1999 | Smith et al. ................. | 438/455 |
| 5,917,280 A | 6/1999 | Burrows et al. | |
| 6,125,226 A | 9/2000 | Forrest et al. | |
| 6,180,239 B1 | 1/2001 | Whitesides et al. | |
| 6,232,714 B1 | 5/2001 | Shen et al. | |
| 6,243,131 B1 | 6/2001 | Martin | |
| 6,274,508 B1 * | 8/2001 | Jacobsen et al. ............ | 438/758 |
| 6,274,980 B1 | 8/2001 | Burrows et al. | |
| 6,281,038 B1 * | 8/2001 | Jacobsen et al. ............ | 438/106 |
| 6,291,266 B1 | 9/2001 | Sayyah | |
| 6,291,896 B1 * | 9/2001 | Smith ......................... | 257/786 |
| 6,316,278 B1 * | 11/2001 | Jacobsen et al. ............. | 438/22 |
| 6,420,266 B1 * | 7/2002 | Smith et al. ................. | 438/692 |
| 6,479,395 B1 | 11/2002 | Smith et al. | |
| 6,498,049 B1 | 12/2002 | Friend et al. | |
| 6,503,831 B2 | 1/2003 | Speakman | |
| 6,507,989 B1 | 1/2003 | Bowden et al. | |
| 6,527,964 B1 * | 3/2003 | Smith et al. ................... | 216/19 |
| 6,545,422 B1 | 4/2003 | George et al. | |
| 6,555,408 B1 | 4/2003 | Jacobsen et al. | |
| 6,566,744 B2 | 5/2003 | Gengel | |
| 6,586,763 B2 | 7/2003 | Marks et al. | |

(Continued)

OTHER PUBLICATIONS

Goodman, R.P.; Schaap, I.A.T.; Tardin, C.F.; Erben, C.M.; Berry, R.M.; Schmidt, C.F.; Turberfield, A.J.; "Rapid Chiral Assembly of Rigid DNA Building Blocks for Molecular Nanofabrication"; Science; Bearing a date of Dec. 9, 2005; pp. 1661-1665; vol. 310; located at www.sciencemag.org.

(Continued)

*Primary Examiner*—Joseph L Williams
(74) *Attorney, Agent, or Firm*—Suiter Swantz pc llo

(57) ABSTRACT

Various embodiments of methods and systems for designing and constructing displays from multiple light-modulating elements are disclosed. Display elements having different light-modulating and self-assembling characteristics may be used during display assembly and operation.

13 Claims, 26 Drawing Sheets

U.S. PATENT DOCUMENTS

| | | | |
|---|---|---|---|
| 6,587,083 | B1 | 7/2003 | Basturk |
| 6,600,467 | B1 | 7/2003 | Webb |
| 6,606,079 | B1 * | 8/2003 | Smith ........................... 345/92 |
| 6,608,439 | B1 | 8/2003 | Sokolik et al. |
| 6,621,471 | B1 | 9/2003 | Ozaki et al. |
| 6,661,393 | B2 | 12/2003 | Tegreene et al. |
| 6,665,044 | B1 * | 12/2003 | Jacobsen et al. ............ 349/187 |
| 6,673,398 | B2 | 1/2004 | Schneider et al. |
| 6,683,663 | B1 * | 1/2004 | Hadley et al. ................. 349/45 |
| 6,693,384 | B1 | 2/2004 | Vicentini et al. |
| 6,698,077 | B2 | 3/2004 | Buchwalter et al. |
| 6,741,386 | B2 * | 5/2004 | Minami ...................... 359/296 |
| 6,809,196 | B2 | 10/2004 | Bamdad et al. |
| 6,850,000 | B1 | 2/2005 | Huang et al. |
| 6,861,136 | B2 | 3/2005 | Verlinden et al. |
| 6,862,009 | B2 | 3/2005 | Park |
| 6,863,402 | B2 | 3/2005 | Roddy et al. |
| 6,864,864 | B2 | 3/2005 | Lin |
| 6,867,551 | B2 | 3/2005 | Okuda |
| 6,927,085 | B2 * | 8/2005 | Hadley et al. ................. 438/28 |
| 6,979,380 | B2 * | 12/2005 | Thorson et al. ............ 156/259 |
| 6,993,709 | B1 * | 1/2006 | Lynn et al. .................. 715/232 |
| 6,998,644 | B1 * | 2/2006 | Boling et al. ................. 257/88 |
| 7,016,704 | B2 * | 3/2006 | Pallakoff .................... 455/566 |
| 7,046,328 | B2 * | 5/2006 | Jacobsen et al. ............ 349/158 |
| 7,061,450 | B2 | 6/2006 | Bright et al. |
| 7,101,502 | B2 * | 9/2006 | Smith et al. ................. 264/232 |
| 7,141,176 | B1 * | 11/2006 | Smith et al. ................... 216/19 |
| 7,172,789 | B2 * | 2/2007 | Smith et al. ................. 427/162 |
| 7,198,411 | B2 * | 4/2007 | Fujii et al. .................... 385/88 |
| 7,232,704 | B2 * | 6/2007 | Singh ......................... 438/106 |
| 7,244,326 | B2 * | 7/2007 | Craig et al. ................. 156/234 |
| 7,321,159 | B2 * | 1/2008 | Schatz ........................ 257/622 |
| 2002/0064909 | A1 | 5/2002 | Gracias et al. |
| 2002/0072074 | A1 | 6/2002 | Zhang et al. |
| 2002/0158814 | A1 | 10/2002 | Bright et al. |
| 2002/0190415 | A1 | 12/2002 | Yang et al. |
| 2003/0158795 | A1 | 8/2003 | Markham et al. |
| 2003/0186469 | A1 | 10/2003 | Fonstad, Jr. et al. |
| 2004/0020774 | A1 | 2/2004 | Aksay et al. |
| 2004/0023414 | A1 | 2/2004 | Zhang et al. |
| 2004/0179145 | A1 * | 9/2004 | Jacobsen et al. .............. 349/45 |
| 2004/0241381 | A1 * | 12/2004 | Chen ......................... 428/66.6 |
| 2006/0132477 | A1 * | 6/2006 | Kerr et al. ................... 345/206 |

OTHER PUBLICATIONS

"DNA self-assembly used to mass-produce patterned nanostructures"; Nanotechnology; Dec. 23, 2005; pp. 1-6; Physorg.com; located at http://www.physorg.com/news9322.html; printed on Feb. 16, 2006.

Agache, Vincent; Quévy, Emmanuel; Collard, Dominique; Buchaillot, Lionel; "Stiction-controlled locking system for three-dimensional self-assembled microstructures: Theory and experimental validation"; Applied Physics Letters; bearing dates of Dec. 3, 2001, Jul. 9, 2001, Sep. 20, 2001, 2001; Jan. 24, 2005; vol. 79, No. 23; pp. 3869-3871; American Institute of Physics.

Aizenberg, Joanna; Black, Andrew J.; Whitesides, George M.; "Control of crystal nucleation by patterned self-assembled monolayers"; Nature: letters to nature; Apr. 8, 1999; vol. 398; pp. 495-498; Macmillan Magazines Ltd.

Bowden, Ned; Choi, Insung S.; Grzybowski, Bartosz A.; Whitesides, George M.; "Mesoscale Self-Assembly of Hexagonal Plates Using Lateral Capillary Forces: Synthesis Using the "Capillary Bond""; J. Am. Chem. Soc.; bearing dates of Nov. 9, 1998, Mar. 5, 1999, May 27, 1999; pp. 5373-5391; American Chemical Society.

Breen, Tricia L.; Tien, Joe; Oliver, Scott R. J.; Hadzic, Tanja; Whitesides, George M.; "Design and Self-Assembly of Open, Regular, 3D Mesostructures"; Science; May 7, 1999; vol. 284; pp. 948-951; located at: www.sciencemag.org.

Chung, Sung-Wook; Ginger, David S.; Morales, Mark W.; Zhang, Zhengfan; Chandrasekhar, Venkat; Ratner, Mark A.; Mirkin, Chad A.; "Top-Down Meets Bottom-Up: Dip-Pen Nanolithography and DNA-Directed Assembly of Nanoscale Electrical Circuits"; Small; bearing dates of May 27, 2004, 2005; No. 1; pp. 2-7; Wiley-VCH Verlag GmbH & Co. KGaA; located at: www.small-journal.com.

"Forming Photonic Crystal Patterns From Hydrogel Nanoparticles"; Spacedaily: Your Portal to Space; Sep. 11, 2003; pp. 1-5; located at: http://www.spacedaily.com/news/nanotech-03zs.html; printed on Mar. 9, 2005.

Freitas Jr., Robert A.; "The Future of Nanofabrication and Molecular Scale Devices in Nanomedicine"; Nanomedicine Book Chapter—MIT-OIS—2001; bearing dates of Jul. 2002, 2001; pp. 1-17; Zyvex Corp.; located at: http://www.rfreitas.com/Nano/FutureNanofabNMed.htm; printed on Mar. 9, 2005.

Gracias, David H.; Tien, Joe; Breen, Tricia L.; Hsu, Carey; Whitesides, George M.; "Forming Electrical Networks in Three Dimensions by Self-Assembly"; Science; Aug. 18, 2000; vol. 289; pp. 1170-1172; located at: www.sciencemag.org.

Grzybowski, Bartosz A.; Bowden, Ned; Arias, Francisco; Yang, Hong; Whtesides, George M.; "Modeling of Menisci and Capillary Forces from the Millimeter to the Micrometer Size Range"; J. Phys. Chem. B; bearing dates of Jul. 24, 2000, Oct. 25, 2000, Dec. 19, 2000, 2001; vol. 105; pp. 404-412; American Chemical Society.

Jakab, Karoly; Neagu, Adrian; Mironov, Vladimir; Markwald, Roger R.; Forgacs, Gabor; "Engineering biological structures of prescribed shape using self-assembling multicellular systems"; PNAS; bearing dates of Mar. 2, 2004, Jan. 8, 2004, 2004, Jul. 20, 2003; vol. 101, No. 9; pp. 2864-2869; located at: www.pnas.org/cgi/doi/10.1073/pnas.0400164101.

"LED Panels—Technical Details"; SuperSCREEN.com; pp. 1-2; located at http://www.superscreen.com/led/en/20mm_panel.php?navid=15; printed on Mar. 31, 2005.

Montemagno, Carlo; Bachand, George; "Constructing nanomechanical devices powered by biomolecular motors"; Nanotechnology; bearing dates of Jan. 21, 1999; vol. 10; pp. 225-231;(+ duplicate Nanotech cover page and duplicate pp. 226, 228, 229, 230, for sake of clarity); IOP Publishing Ltd.

Redl, F.X.; Cho, K.-S.; Murray, C.B., O'Brien, S.; "Three-dimensional binary superlattices of magnetic nanocrystals and semiconductor quantum dots"; Nature; Jun. 26, 2003; bearing a date of 2003; vol. 423; pp. 968-971; Nature Publishing Group.

Segelken, Roger; "First Biomolecular Motors with Metal Propellers are Reported by Cornell Nanobiotechnologists"; NanoMeter; Spring 2001; vol. 12, No. 1; pp. 1-8; Cornell Nanofabrication Facility.

Srinivasan, Uthara; Liepmann, Dorian; Howe, Roger T.- *Fellow, IEEE*; "Microstructure to Substrate Self-Assembly Using Capillary Forces"; Journal of Microelectromechanical Systems; bearing dates of Jul. 21, 2000, Oct. 15, 2000, Mar. 2001; vol. 10, No. 1; pp. 17-24; IEEE.

Tien, Joe; Terfort, Andreas; Whitesides, George M.; "Microfabrication through Electrostatic Self-Assembly"; Langmuir; bearing dates of May 2, 1997, Jul. 29, 1997, 1997; vol. 13; pp. 5349-5355; American Chemical Society.

Whitesides, George M.; Grzybowski, Bartosz; "Self-Assembly at All Scales"; Science; Mar. 29, 2002; vol. 295; pp. 2418-2421; located at: www.sciencemag.org.

Xiong, Xiaorong; Hanein, Yael-*Member, IEEE*; Fang, Jiandong; Wang, Yanbing; Wang, Weihua; Schwartz, Daniel T.; Böhringer, Karl F.-*Member, IEEE*; "Controlled Multibatch Self-Assembly of Microdevices"; Journal of Microelectromechanical Systems; bearing dates of Apr. 2003, 2003; vol. 12, No. 2; pp. 117-127, Errata; IEEE.

Zheng, Wei; Buhlmann, Philippe; Jacobs, Heiko O.; "Sequential shape-and-solder-directed self-assembly of functional microsystems"; PNAS; bearing dates of Jul. 23, 2004, Jun. 21, 2004, Aug. 31, 2004; vol. 101, No. 35; pp. 12814-12817; The National Academy of Sciences of the USA; located at: www.pnas.org/cgi/doi/10.1073/pnas.0404437101.

U.S. Appl. No. 11/499,247, Hillis et al.
U.S. Appl. No. 11/497,793, Hillis et al.
U.S. Appl. No. 11/449,516, Hillis et al.
U.S. Appl. No. 11/447,682, Hillis et al.
U.S. Appl. No. 11/447,611, Hillis et al.

U.S. Appl. No. 11/113,453, Hillis et al.
U.S. Appl. No. 11/099,409, Hillis et al.
U.S. Appl. No. 11/078,207, Hillis et al.
U.S. Appl. No. 11/078,206, Hillis et al.
Licata, Nicholas A.; Tkachenko, Alexei V.; "Error-proof programmable self-assembly of DNA-nanoparticle clusters"; pp. 1-5; located at http://xxx.lanl.gov/PS_cache/cond-mat/pdf/0504/0504407.pdf; bearing a date of Apr. 16, 2005; Department of Physics; University of Michigan; Ann Arbor; Michigan.

* cited by examiner

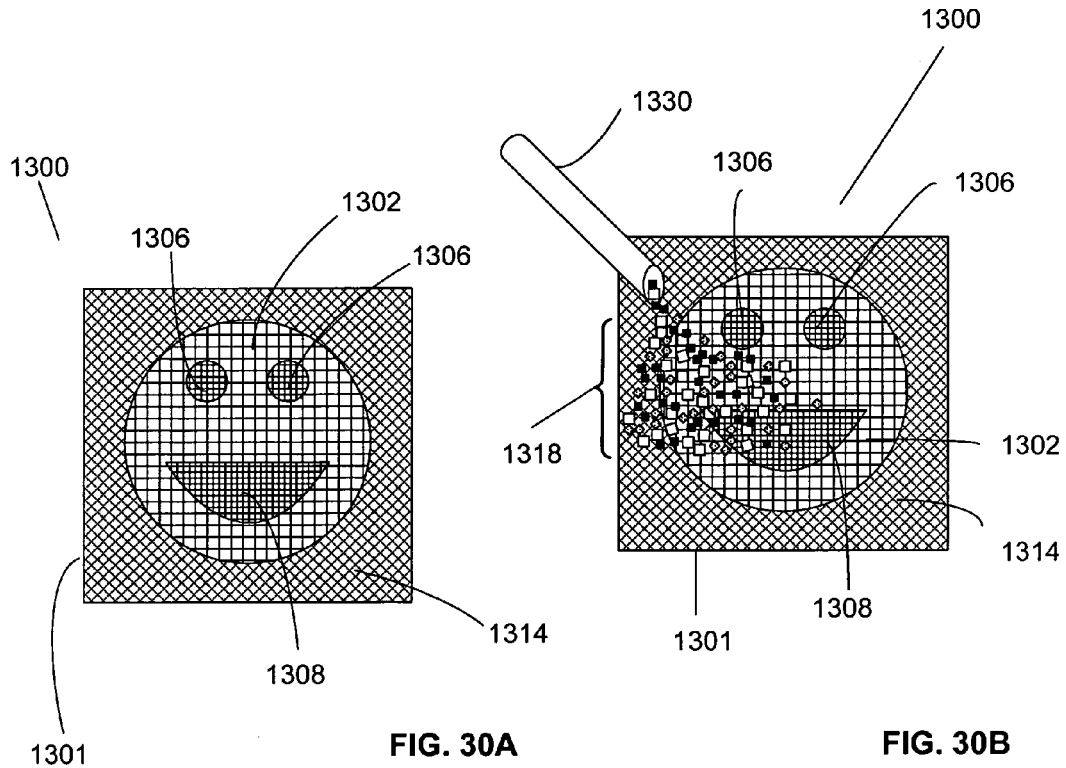
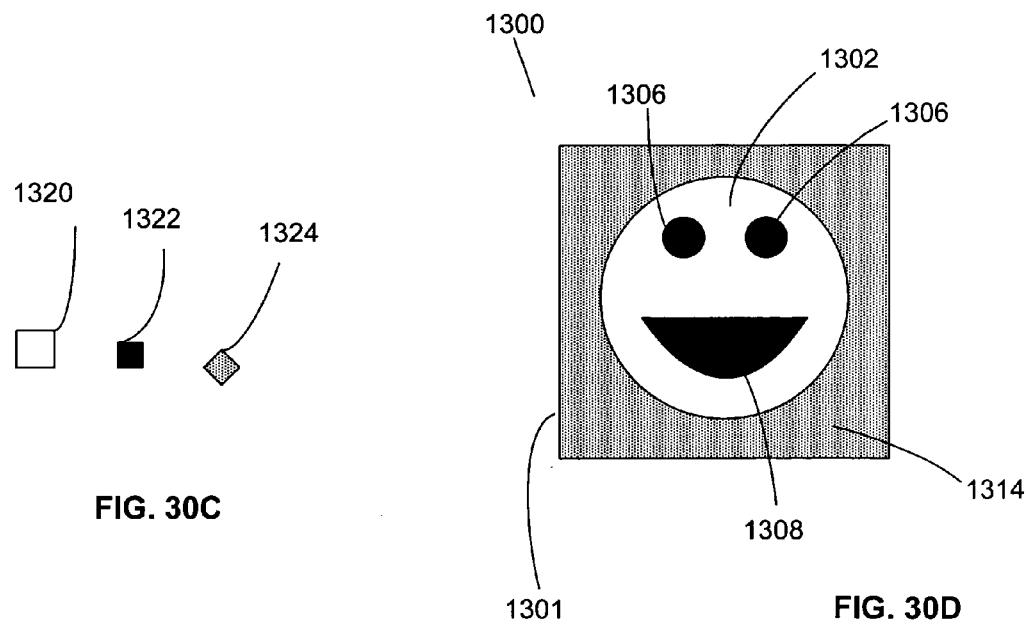
FIG. 30A  FIG. 30B
FIG. 30C  FIG. 30D

METHOD OF ASSEMBLING DISPLAYS ON SUBSTRATES

CROSS-REFERENCE TO RELATED APPLICATIONS

The present application is related to, claims the earliest available effective filing date(s) from (e.g., claims earliest available priority dates for other than provisional patent applications; claims benefits under 35 USC §119(e) for provisional patent applications), and incorporates by reference in its entirety all subject matter of the following listed application(s); the present application also claims the earliest available effective filing date(s) from, and also incorporates by reference in its entirety all subject matter of any and all parent, grandparent, great-grandparent, etc. applications of the following listed application(s):

1. United States patent application entitled ELEMENTS FOR SELF-ASSEMBLING DISPLAYS, naming W. Daniel Hillis, Nathan P. Myhrvold, Clarence T. Tegreene, Lowell L. Wood, Jr., and Victoria Y. H. Wood as inventors, filed Mar. 11, 2005.
2. United States patent application entitled SELF-ASSEMBLY OF ELEMENTS FOR DISPLAYS, naming W. Daniel Hillis, Nathan P. Myhrvold, Clarence T. Tegreene, Lowell L. Wood, Jr., and Victoria Y. H. Wood as inventors, filed Mar. 11, 2005.
3. United States patent application entitled SELF ASSEMBLING DISPLAY WITH SUBSTRATE, naming W. Daniel Hillis, Nathan P. Myhrvold, Clarence T. Tegreene, Lowell L. Wood, Jr., and Victoria Y. H. Wood as inventors, filed substantially herewith.
4. United States patent application entitled SUPERIMPOSED DISPLAYS, naming W. Daniel Hillis, Nathan P. Myhrvold, Clarence T. Tegreene, and Lowell L. Wood, Jr. as inventors, filed Apr. 22, 2005.

TECHNICAL FIELD

The present application relates, in general, to the field of displays, and particularly to methods of manufacture thereof.

BACKGROUND

Displays used in television screens, computer monitors, electronic signs or displays, and the like may be formed from arrays of large numbers of light-emitting elements that may be controlled to display time-varying patterns of light. Color displays typically include light-emitting elements that emit light of several colors. Displays commonly include elements capable of emitting red, green, or blue wavelengths (corresponding to the color sensitivities of the photoreceptors in the human eye), since by adjusting the intensity of the three colors appropriately, any color in the visible spectrum can be represented to the human eye.

SUMMARY

Embodiments of methods and systems for self-organization and assembly of display elements with substrates to form displays are disclosed herein. Features of various embodiments will be apparent from the following detailed description and associated drawings.

BRIEF DESCRIPTION OF THE FIGURES

Features of the invention are set forth in the appended claims. The exemplary embodiments may best be understood by making reference to the following description taken in conjunction with the accompanying drawings. In the figures, like referenced numerals identify like elements.

FIGS. 30A-30D illustrate the manufacture of a display having several regions;

DETAILED DESCRIPTION

In the following detailed description, reference is made to the accompanying drawings, which form a part hereof. The detailed description and the drawings illustrate specific exemplary embodiments by which the invention may be practiced. These embodiments are described in sufficient detail to enable those skilled in the art to practice the invention. It is understood that other embodiments may be utilized, and other changes may be made, without departing from the spirit or scope of the present invention. The following detailed description is therefore not to be taken in a limiting sense, and the scope of the present invention is defined by the appended claims.

Throughout the specification and claims, the following terms take the meanings explicitly associated herein unless the context dictates otherwise. The meaning of "a", "an", and "the" include plural references. The meaning of "in" includes "in" and "on." A reference to the singular includes a reference to the plural unless otherwise stated or inconsistent with the disclosure herein.

According to an exemplary embodiment, a display is constructed that has a plurality of display elements located at a plurality of receptor locations on a substrate. Each display element may include a light-modulating element of a respective type, carried by a carrier having respective shape, size or surface characteristics. Display elements may have shape, size or surface characteristics complementary to the shape, size or surface characteristics of certain receptor locations on the substrate, to promote self-assembly of display elements to selected receptor locations. Display elements containing light-modulating elements of like types are characterized by like shape, size or surface characteristics. Accordingly, display elements containing specific types of light-modulating elements self-assemble to the substrate at selected locations, to form a display having a desired arrangement of light-emitting elements. Light-modulating elements include elements which modulate light perceived by a viewer of the display. In some embodiments, light-modulating elements may be light-emitting elements. In other embodiments, light-modulating elements modify or modulate light incident on the display to present a modified view to the viewer by, for example, absorbing, reflecting, diffracting, or scattering light, or by fluorescing or performing some other type of frequency conversion. Although specific types of light-modulating elements may be referenced in connection with certain exemplary embodiments described herein, unless it is stated that a particular type of light-modulating element is required for use in a particular embodiment, it should be assumed that other types of light-modulating elements may be used in the embodiment as well.

Figure 1:
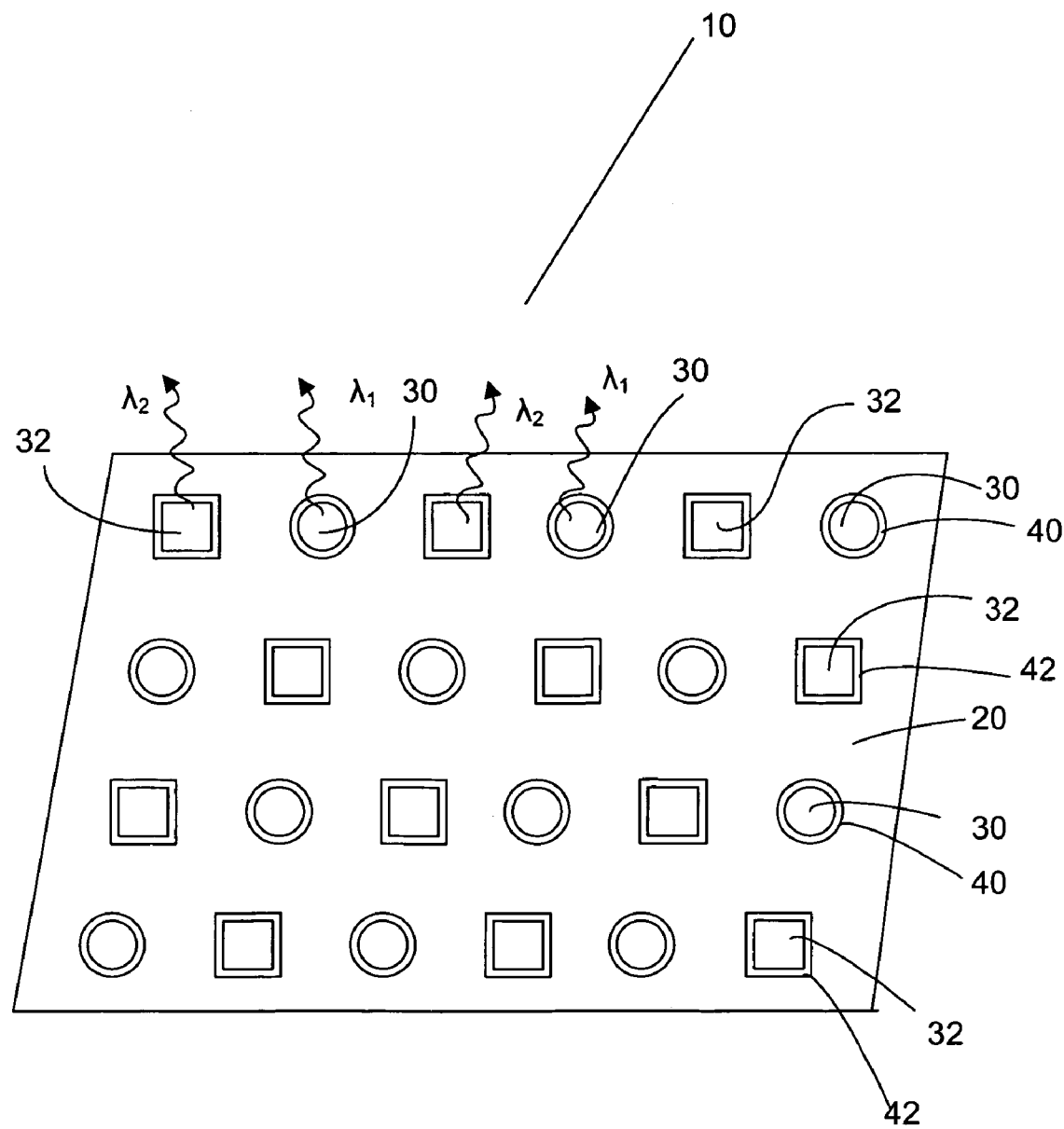
FIG. 1 illustrates an embodiment of a display element array.

FIG. 1 depicts an exemplary embodiment of a display element array 10 including a substrate 20 and a plurality of display elements 30 and 32 mounted in corresponding receptor locations 40 and 42, respectively. In the example of FIG. 1, display elements 30 are a first type of display elements and display elements 32 are a second type of display element. The display may include a substrate 20 having a first plurality of receptor locations of first type 40 and a second plurality of receptor locations of second type 42, which are adapted to receive display elements 30 and 32, respectively, arranged in a regular, repeating pattern according to type, as depicted in FIG. 1.

Figure 2:
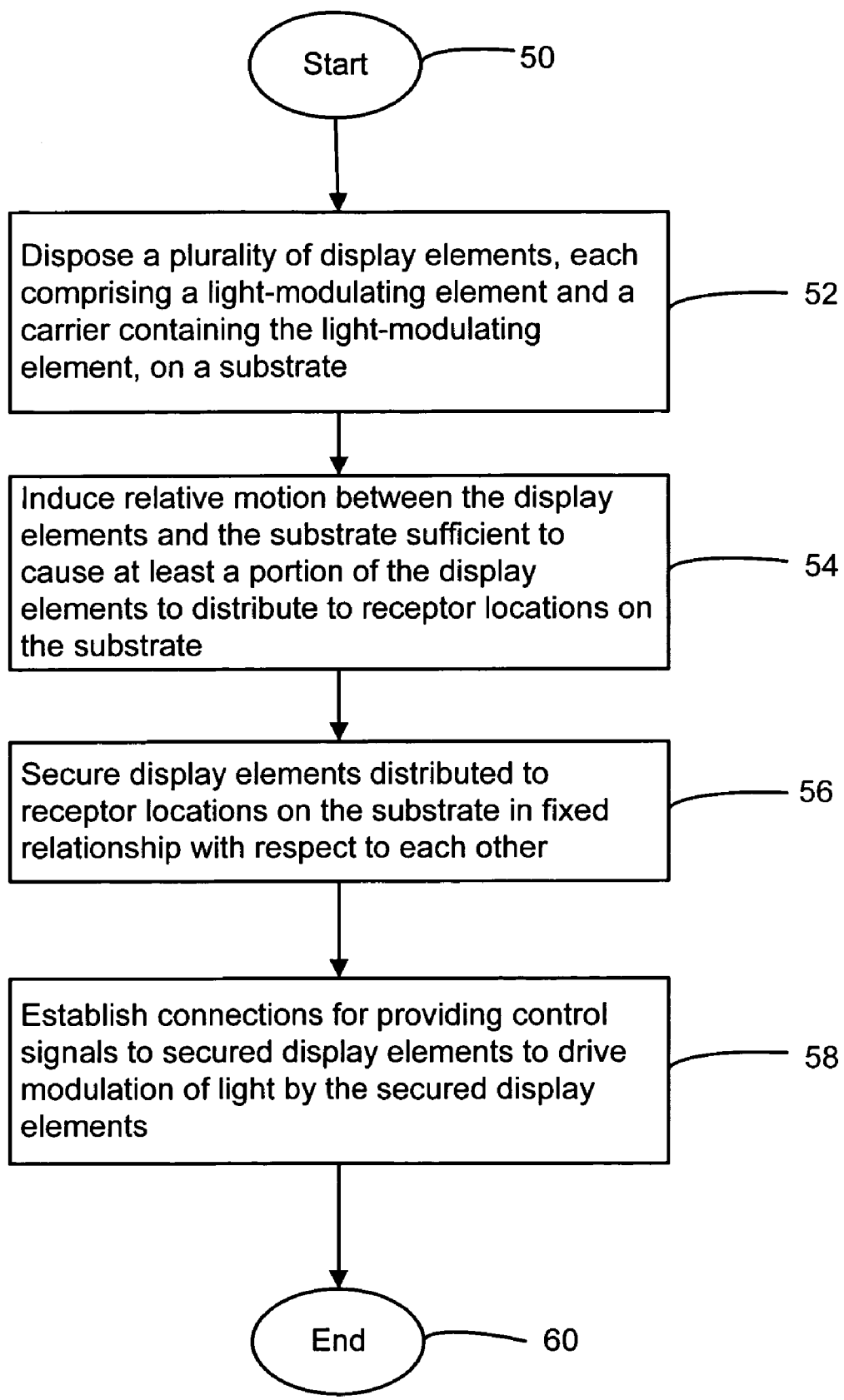
FIG. 2 depicts a method of forming an embodiment of the display element array.

A method of constructing a display element array as illustrated in FIG. 1 is outlined generally in FIG. 2. At step 52, a plurality of display elements, each of which includes a light-modulating element, is disposed on a substrate. At step 54, relative motion is induced between the display elements and the substrate sufficient to cause at least a portion of the display elements to distribute to receptor locations on the substrate. At step 56, display elements distributed to receptor locations on the substrate are secured in fixed relationship with respect to each other. At step 58, connections are established for providing control signals to secured display elements to drive emission of light by the secured display elements.

Disposing a plurality of display elements on the substrate may include disposing a first subset of display elements and a second subset of display elements on the substrate. Each display element in the first subset may include a light-modulating element of a first type contained in a carrier having a first shape, size or surface characteristic, and each display element in the second subset may include a light-modulating element of a second type contained in a carrier having a second shape, size or surface characteristic. The substrate may include a first subset of receptor locations having a first complementary shape, size or surface characteristic that facilitates distribution of display elements of the first subset to the first subset of receptor locations, and a second subset of receptor locations having a second complementary shape, size or surface characteristic that facilitates distribution of display elements of the second subset to the second subset of receptor locations.

Figure 3:
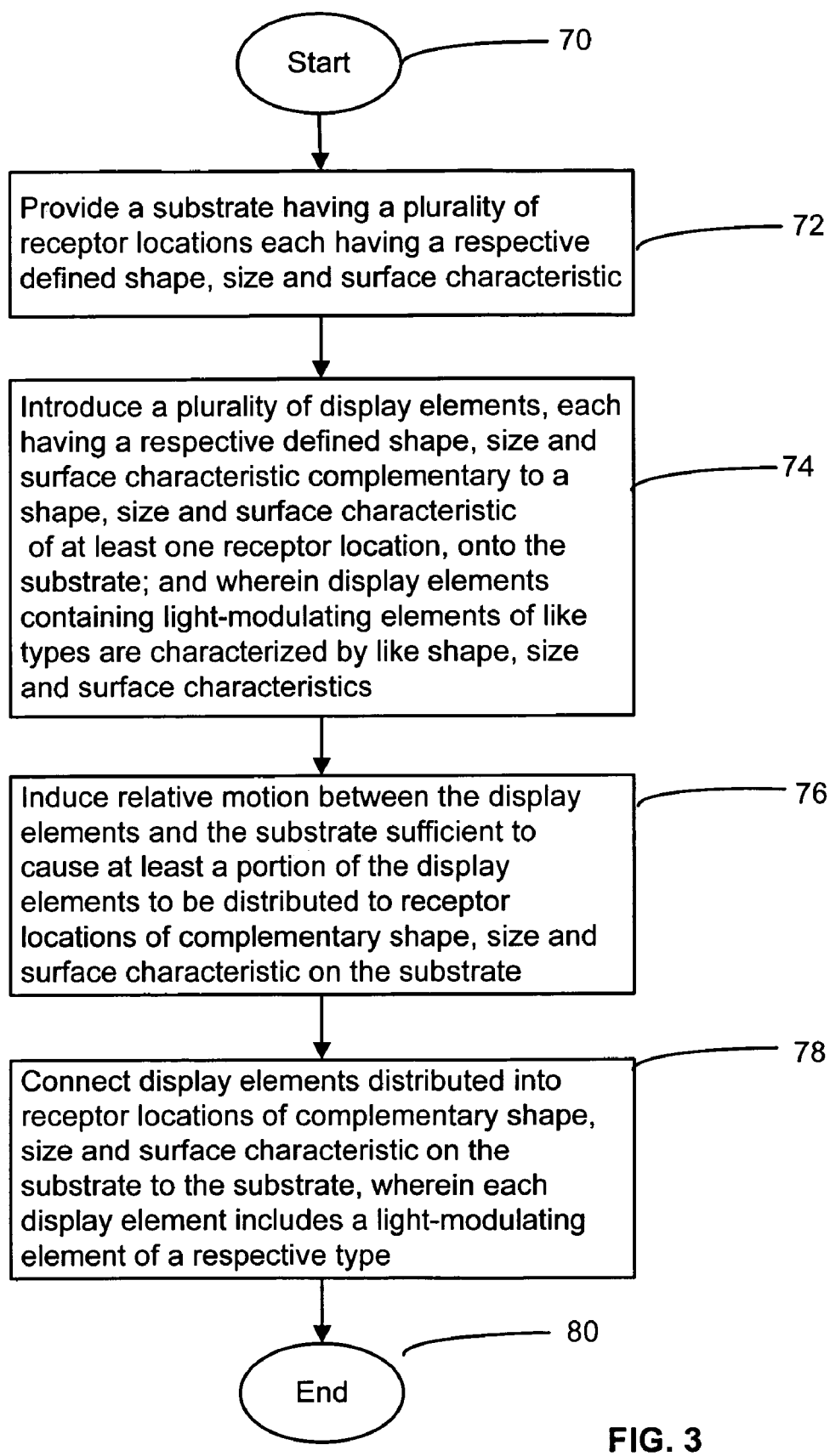
FIG. 3 illustrates a method of forming an embodiment of a display element array.

A further exemplary method of display element array construction is described in FIG. 3. At step 72, a substrate is provided having a plurality of receptor locations each having a respective defined shape, size and surface characteristic. At step 74, a plurality of display elements, each having a respective defined shape, size and surface characteristic complementary to a shape, size and surface characteristic of at least one receptacle are introduced onto the substrate. Display elements containing light-modulating elements of like types are characterized by like shapes, sizes and surface characteristics. Relative motion is induced between the display elements and the substrate sufficient to cause at least a portion of the display elements to be distributed to receptacles of complementary shape and size on the substrate at step 76. At step 78, display elements distributed into receptacles of complementary shape, size and surface characteristic on the substrate are connected to the substrate.

First and second types of receptor locations (and corresponding display elements), as depicted in FIG. 1, may have one or more respective shape, size, surface, or other characteristics. Each receptor location of the first type may have a first surface characteristic, and each receptor location of the second type may comprise a second surface characteristic. A display may also comprise a plurality of display elements of the first type mounted on the substrate at the first plurality of receptor locations, and a plurality of display elements of the second type mounted on the substrate at the second plurality of receptor locations. Each display element of the first type comprises a surface characteristic adapted to operate cooperatively with the first surface characteristic on the first type of receptor location to facilitate self-assembly of the first display element type with the first receptor location type, and each display element of the second type includes a surface characteristic adapted to operate cooperatively with the second surface characteristic on the second type of receptor location to facilitate self-assembly of the second display element type with the second receptor location type. Display elements of the first type may emit light that differs from light emitted by display elements of the second type by one or more parameters including wavelength band envelope, spectral width and/or content, power, spatial or temporal emission pattern/pulse format, direction of emission, intensity, brightness, irradiance, polarization, response speed, or linearity.

Figure 4:
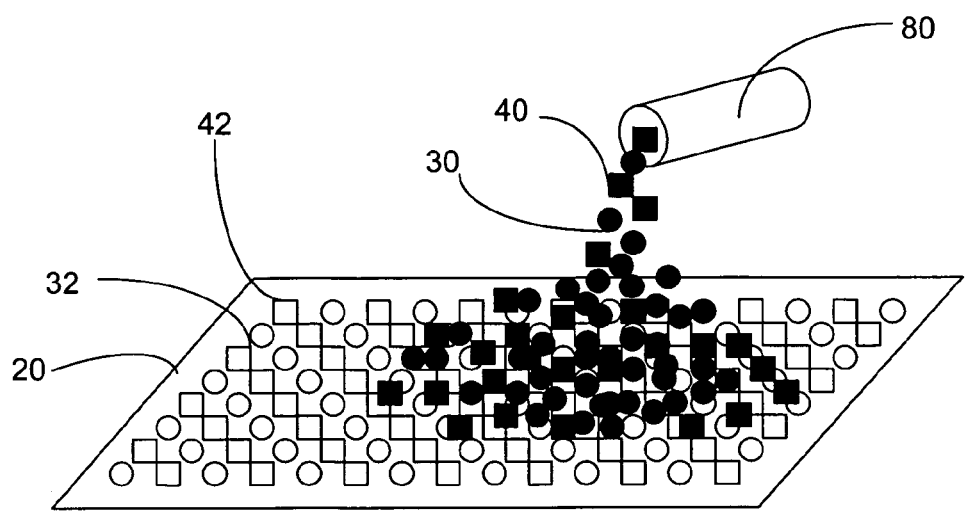
FIG. 4 illustrates a method of disposing display elements on a substrate.
Figure 5:
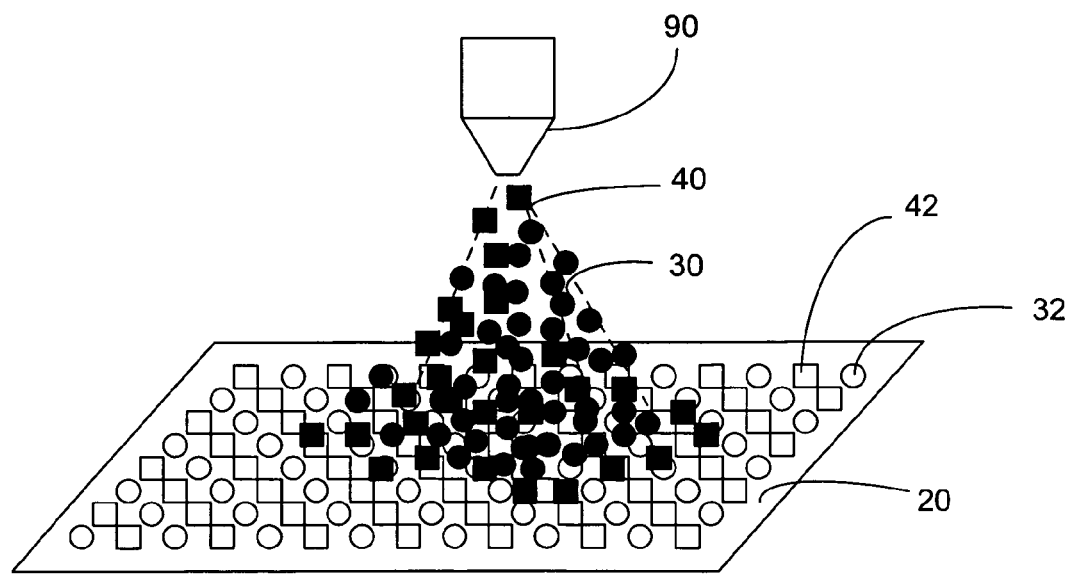
FIG. 5 depicts a further method of disposing display elements on a substrate.

Display elements may be disposed on a substrate by various methods. FIG. 4 illustrates an exemplary method of disposing display elements 30 and 40 onto substrate 20. In the embodiment of FIG. 4, display elements 30 and 40 are poured onto substrate 20 from dispenser 80. As used herein, 'pouring' refers to a process by which multiple display elements 30 and 40 are moved onto substrate 20 from a container or dispenser 80 by means of gravity or other means of inducing a body force on them or a bulk acceleration of them. FIG. 5 illustrates another method of disposing display elements 30 and 40 onto substrate 20 by spraying. As used herein, 'spraying' refers to a process by which display elements are ejected from container or dispenser via pressure, e.g., via spray nozzle 90. Spray nozzle 90 may be configured to disperse display elements 30 and 40 over substrate 20. In the embodiments depicted in FIGS. 4 and 5, display elements may be mixed into a carrier liquid and applied in the form of a slurry, emulsion, suspension, colloid or gel, or fluidized by the addition of a gas. They may also be disposed onto the substrate without being mixed into a carrier liquid or gas. Note that although two types of display elements, 30 and 40, are depicted in the present exemplary embodiments, in other embodiments, one, two, three, or more different types of display elements may be used, and the methods described herein may be suitable in embodiments including various numbers of types of display elements.

After display elements are disposed on a substrate, they may self-assemble into preferred receptor locations, as determined by their respective surface or shape characteristics. In some embodiments, movement of display elements into preferred receptor locations is energetically favored. In some cases, surface or shape characteristics may produce sufficiently strong attractions between display elements and preferred receptor locations that they self-assemble into a preferred arrangement on the substrate without further input of energy. In many cases, however, input of energy (e.g., an activation energy) may be required to cause display elements to move into their preferred receptor locations. Energy may be input to the display elements by imparting relative motion between display elements and substrate, e.g. by shaking or vibrating the substrate. Display elements may then move with respect to each other until they eventually move into preferred receptor locations. Other forms of activation energy (e.g., light, heat, chemical energy) may also be used to promote distribution of display elements into preferred receptor locations. Each of the activation energies may be applied independently or a plurality of forms of activation energies may be applied in combination. The method may include controlling an environmental condition to promote distribution of the display elements to receptor locations on the substrate.

In order to promote self-assembly of display elements into receptor locations, relative movement of the multiple display elements and the substrate may be induced. Such movement may be imparted, for example, by shaking or vibration of the substrate. The movement may cause the display elements to distribute into a single layer on the substrate. Relative movement of the display elements and the surface may be induced by shaking or vibrating the surface, or by otherwise moving the surface. The induced movement may be random or substantially random. The movement must be sufficient to move display elements relative to other display elements in order to cause display elements to come into proximity and have opportunity for interaction and/or association with display elements of various types. The pattern of shaking or vibration may be modified over time; e.g., more vigorous movement may be used to cause display elements to form a single layer, while movement that is gentler (or of a different frequency, direction, etc.) may be more effective for promoting associations of display elements within a single layer. Depending on the size and type of display elements and substrate, various methods of imparting motion and/or interaction between display elements and substrate may be used, and the embodiments depicted herein are only examples.

Figure 6A:
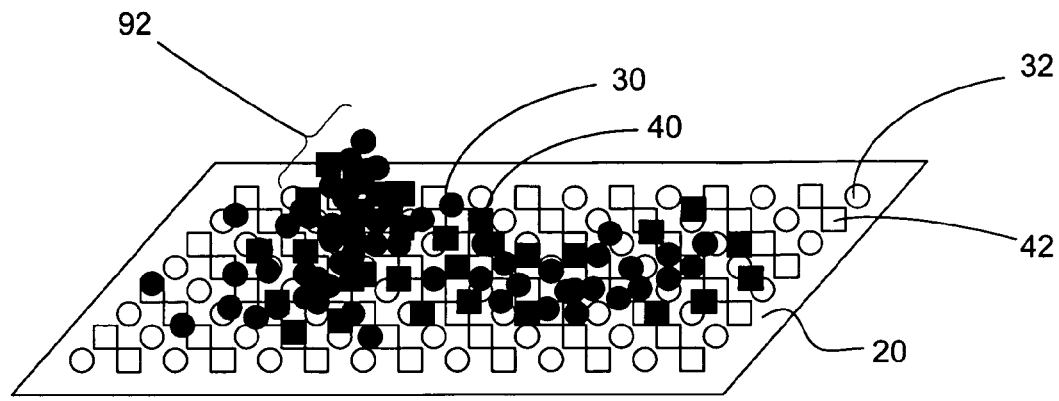
FIGS. 6A-6C illustrates distribution display elements to receptor locations on a substrate.
Figure 6B:
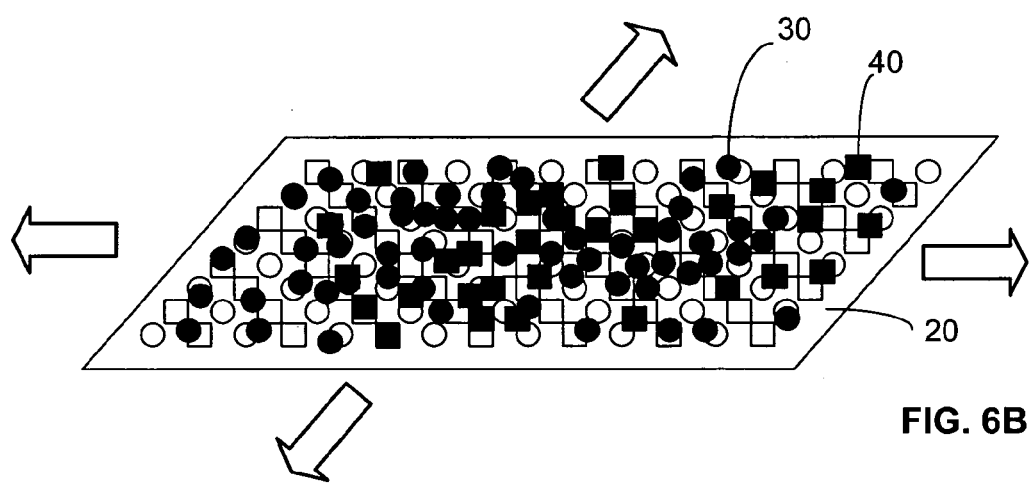
Figure 6C:
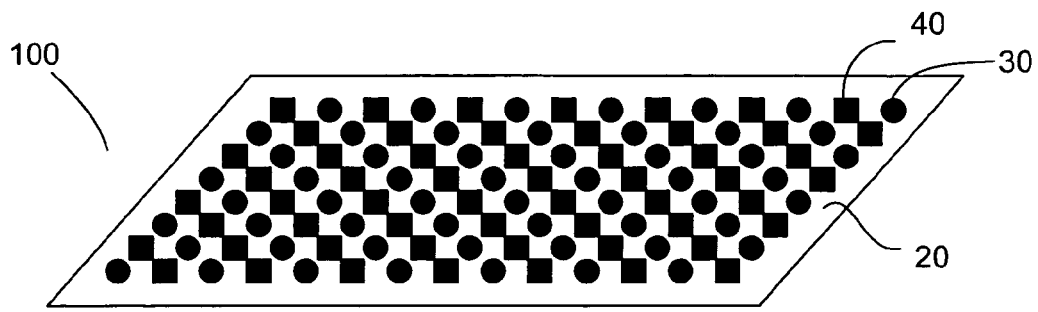

As shown in FIG. 6A, display elements 30 and 40 disposed on substrate 20 may not initially be distributed over substrate 20 in a single layer. In some regions (e.g., region 92 in FIG. 6A), display elements may be piled on other display elements in two or more layers. In many cases, it is preferred that display elements distribute into a single layer on substrate 20. Distribution of display elements into a single layer may be aided by gravity as well as by induced movement between display elements and surface. In certain embodiments, distribution of display elements into a single layer may be aided by repulsion of one or more surfaces of the display element from the substrate surface. Such repulsion may take place, for example, because of surface energy effects, surface magnetic properties, and the like, due to suitable treatment of display elements and substrate surfaces. At the step depicted in FIG. 6B, shaking or vibrating substrate 20 may cause display elements 30 and 40 to disperse further to form a single layer of display elements on substrate 20. Further shaking or vibration may be applied to cause display elements 30 and 40, already distributed in a single layer on substrate 20, to move into appropriate receptor locations 32 and 42, respectively, to form display element array 100 as shown in FIG. 6C. If display elements 30 and 40 are small enough and have suitable shape and surface characteristics, their behavior may be powder- or fluid-like. In order to facilitate the distribution of display elements 30 and 40 onto substrate 20, display elements may be mixed into a fluid or fluidized medium, and applied to substrate 20 as a slurry, emulsion, suspension, colloid, or gel. Movement of display elements 30 and 40 on substrate 20 may also be facilitated by various mechanical spreaders, stirrers, etc., instead of or in addition to shaking, vibration, or other methods of imparting energy to the display elements and/or substrate.

Figure 7A:
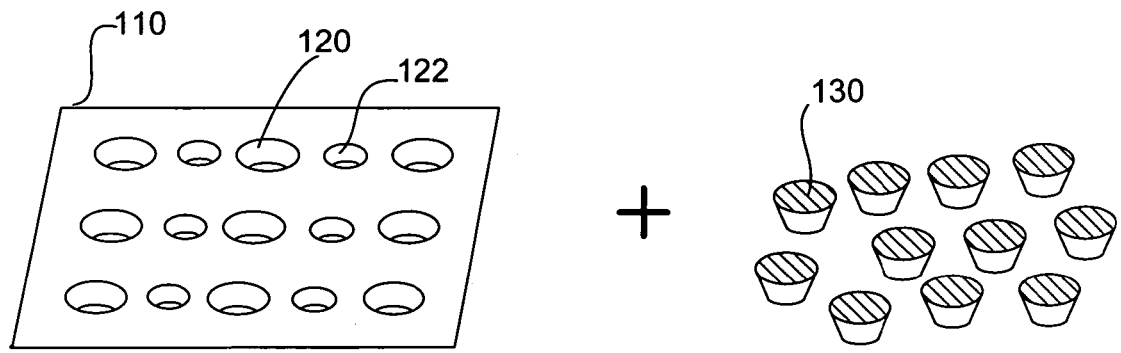
FIGS. 7A-7C illustrate distribution of a first set of display elements to receptor locations on a substrate.
Figure 7B:
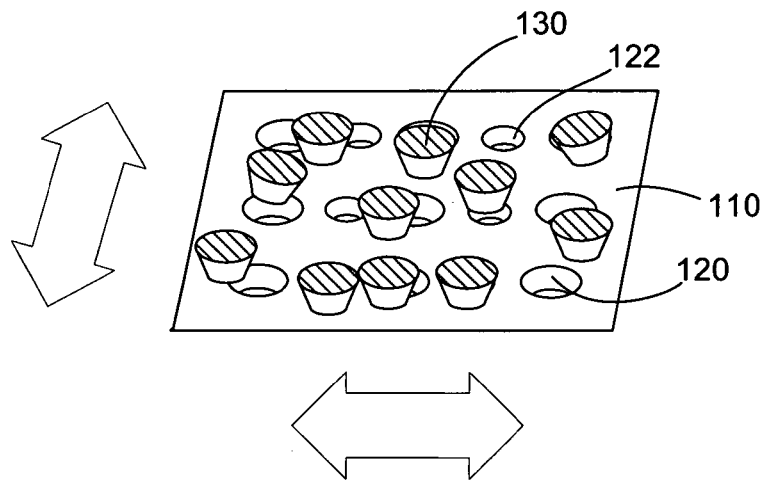
Figure 7C:
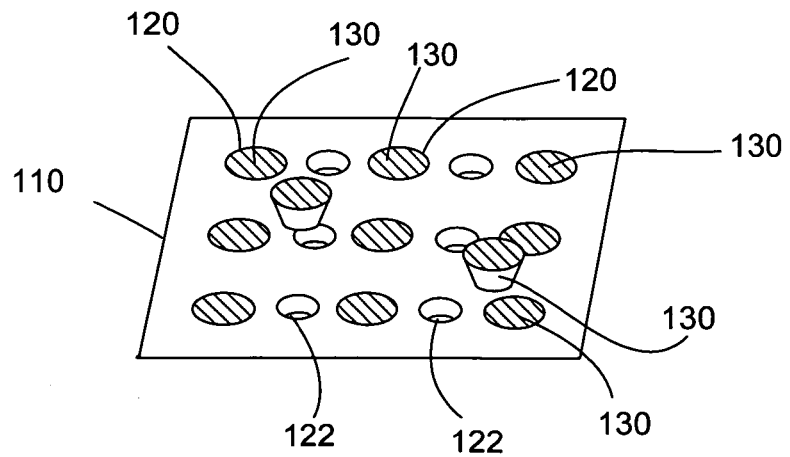

One method of assembling display elements of two different types into respective receptor locations on a substrate makes use of a two-stage process. During the first stage of the process, illustrated in FIGS. 7A-7C, a first type of display elements is assembled into a first type of receptor locations on a substrate. As depicted in FIG. 7A, a substrate 110 is provided which includes first receptor locations 120, which are of a first type, and second receptor locations 122, which are of a second type. In the exemplary embodiment depicted in FIGS. 7A, receptor location 120 and 122 are circular receptacles of different sizes, with receptor locations 120 being larger than receptor locations 122. A first set of display elements made up of a first type of display elements 130 is disposed on substrate 110. Display elements 130 have a size and shape complementary to first receptor locations 120. Display elements 130 are too large to fit into second receptor locations 122. In step 7B, relative motion may be induced between display elements 130 and substrate 110, for example by shaking or vibrating substrate 110. The relative motion is sufficient to cause display elements 130 to self assemble into respective receptor locations 120, as shown in FIG. 7C. Display elements 130 in excess of the number needed to fill receptor locations 120 may remain on the surface of substrate 110.

Figure 8:
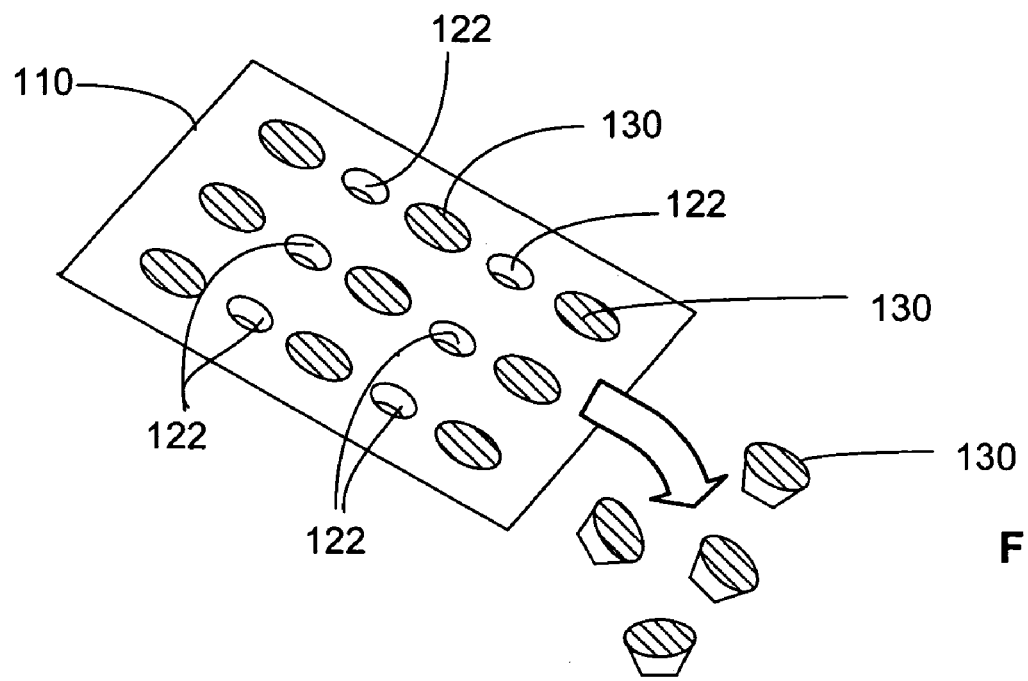
FIG. 8 illustrates removal of excess display elements from of a substrate.
Figure 9:
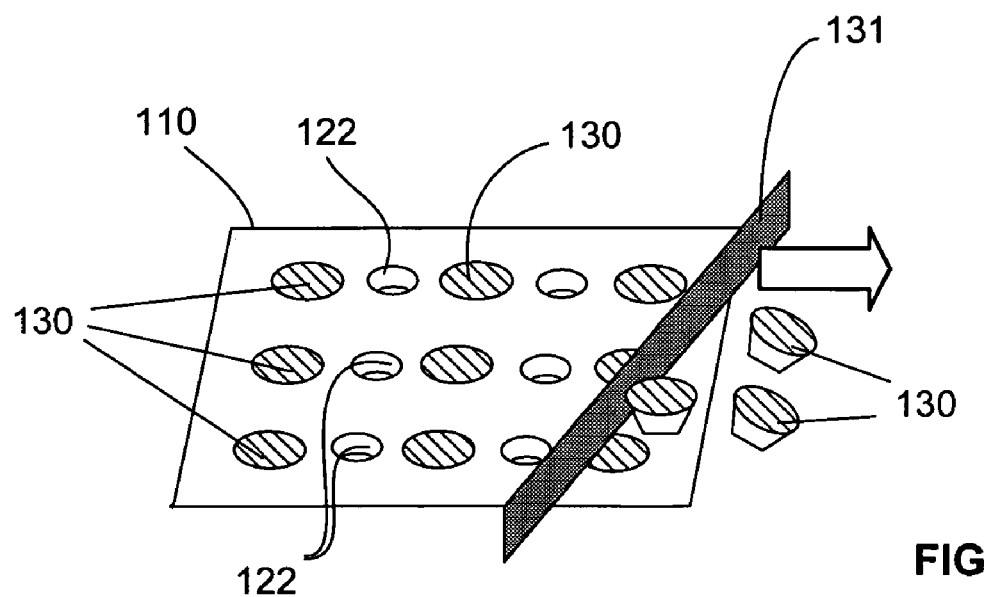
FIG. 9 illustrates an alternative method of removing excess display elements from a substrate.

The method may include removing display elements that have not distributed into receptacles on the substrate from the substrate. Removing display elements may include removing display elements not distributed into receptacles of complementary shape, size, and surface characteristic on the substrate from the substrate prior to connecting display elements that have distributed into receptacles. Display elements may be removed from the substrate by moving or accelerating the substrate, for example, by shaking or by tipping the substrate, as depicted in FIG. 8. In other embodiments, display elements may be removed from the substrate by applying a fluid to the substrate, e.g., by rinsing it. Display elements may also be removed from the substrate 110 by applying motive force to the display elements, for example, with a scraper 131, as depicted in FIG. 9. Display elements removed from the substrate may be recovered for later use.

Figure 10A:
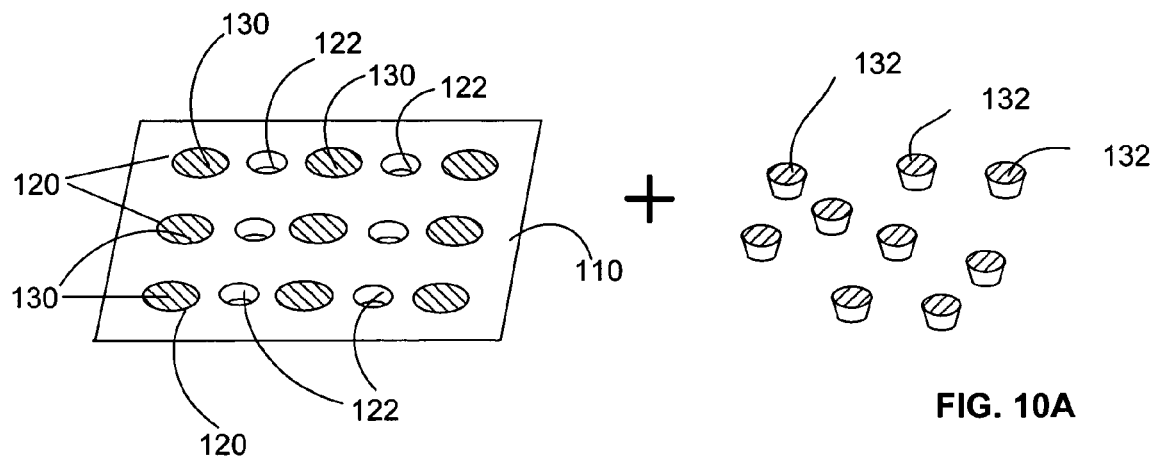
FIGS. 10A-10C illustrates distribution of a second set of display elements to receptor locations on a substrate.
Figure 10B:
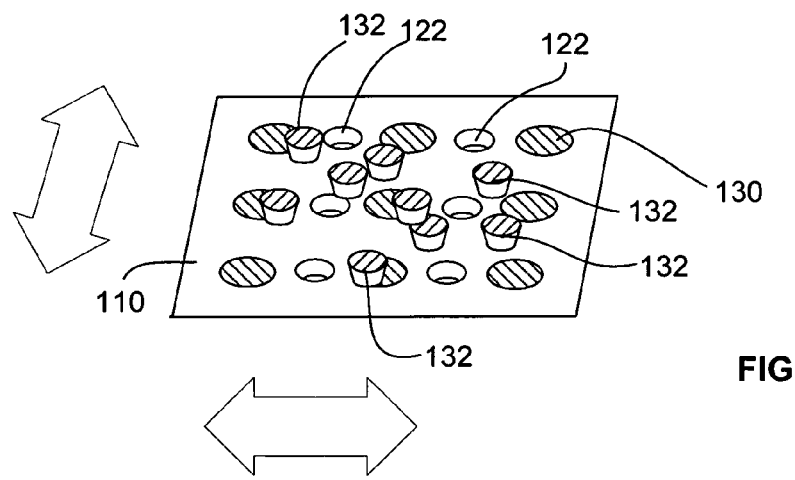
Figure 10C:
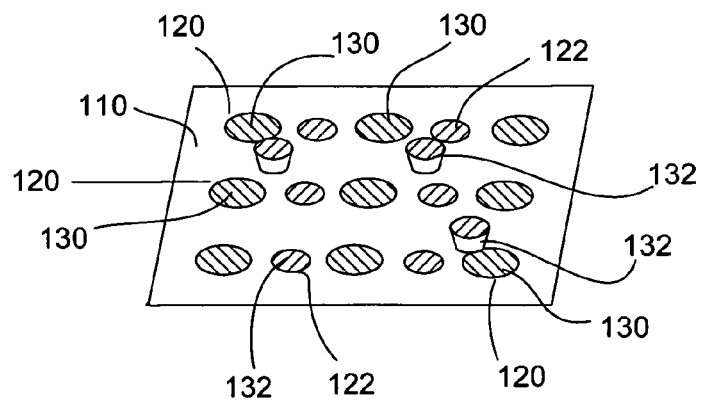

In the second stage of the two-stage process, as depicted in FIGS. 10A-10C, a second type of display elements 132 are distributed into second receptor locations 122 on substrate 110. FIG. 10A illustrates substrate 110, with first receptor locations 120 filled with first display elements 130, and receptor locations 122 vacant. As illustrated in FIG. 10B, after a second set of display elements 132 is distributed onto substrate 110, relative motion is induced between substrate 110 and display elements 132 sufficient to cause display elements 132 to self-assemble to their respective receptor locations 122. FIG. 10C depicts substrate 110 with all receptor locations 120 and 122 filled, and several excess display elements 132 resting on top of substrate 110. Excess display elements can be removed by various methods, including, but not limited to, those depicted in FIGS. 8 and 9.

As illustrated in FIGS. 7A-10C, receptacles 120 are complementary to display elements 130, which are of a first size and shape, and receptacles 122 are complementary to display elements 132, which are of a second size and shape. Display elements 130 in the first set are configured to have a probability of fitting into receptacles 122 that is lower than the probability of display elements 132 fitting into receptacles 120. Various display element/receptor location combinations may be devised in which the one type of display element has a relatively higher probability of distributing into the incorrect receptor location than does the other. Therefore, assembly of display elements into the appropriate locations can be improved by introducing the different display elements in a specified order, with those having the lowest probability of distributing into an incorrect receptor location being introduced earliest in the process. This approach may be extended to displays that include more than two types of display elements and receptor locations. In some embodiments, display elements of the first size and shape are of a different size, but substantially the same shape as display elements of the second size and shape. In other embodiments, display elements of the first size and shape are of a different shape, but substantially the same size as display elements of the second size and shape. In some embodiments display elements of the first size and shape may be larger than display elements of the second size and shape. Display elements in the first set may include light-modulating elements that are of a different type than light-modulating elements in display elements in the second set. In some embodiments, display elements in the first set may include light-modulating elements capable of emitting light in a first wavelength band and display elements in the second set may include light-modulating elements capable of emitting light in a second wavelength band.

In certain embodiments, the display elements from at least one of the first set and the second set may be connected to the substrate by at least one of heat, vibration, pressure, electrostatic or magnetostatic force, a chemical, radiation, or an adhesive. In some embodiments, connecting display elements to the substrate may include making electrical or optical connections between the display elements and the substrate. Display elements may also be connected to adjacent display elements. In some embodiments, display elements may be connected to adjacent display elements via the substrate, by forming electrical or optical connections between display elements and the substrate.

Figure 11:
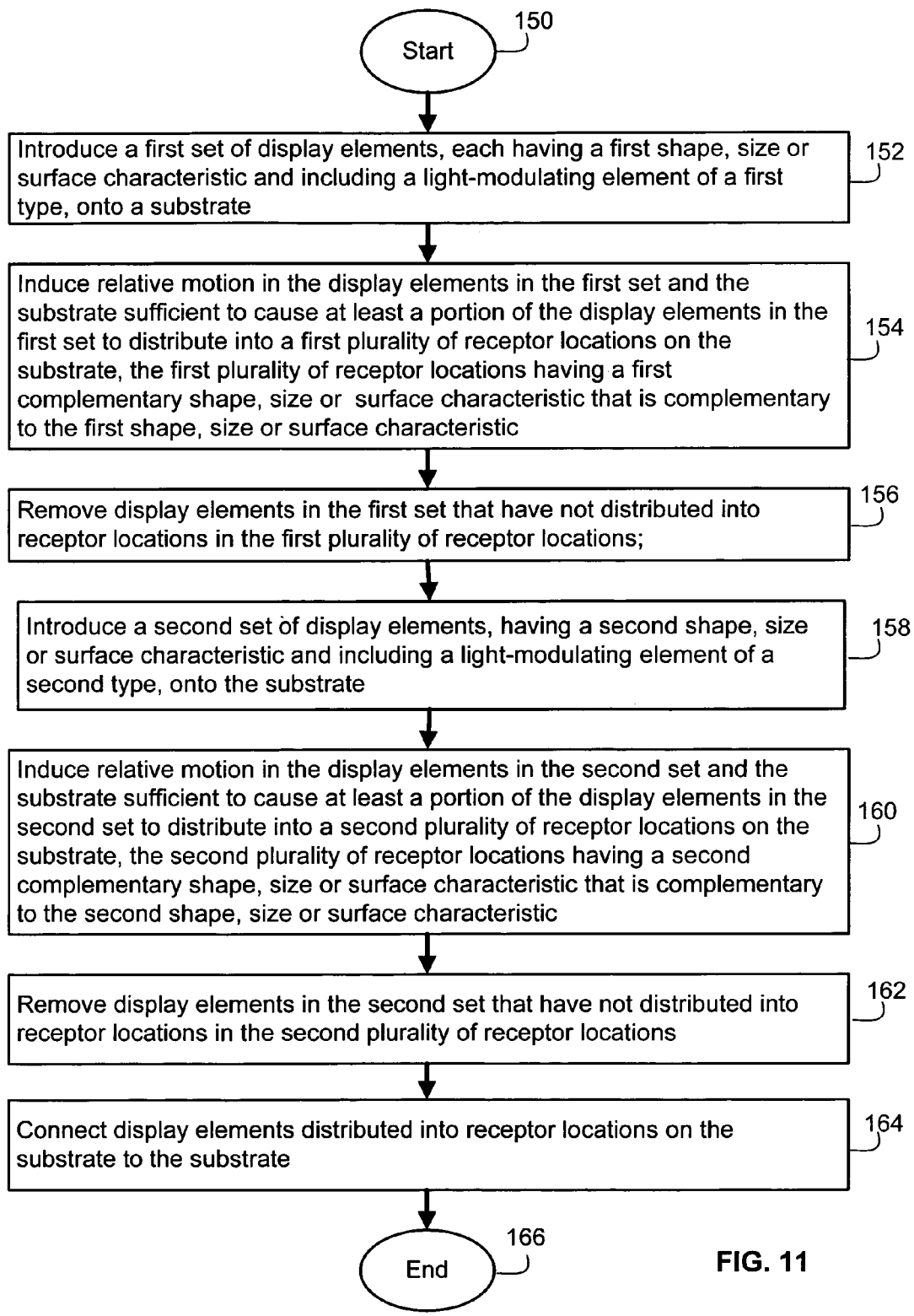
FIG. 11 is a flow diagram illustrating a method of assembling a display element array.

FIG. 11 is a flow diagram outlining a method of forming a display with two types of display elements by introducing the two types of display elements to the substrate in sequence. An example of this type of process is depicted in FIGS. 7A-10C. The first type of display elements has a first shape, size or surface characteristic, and the second type of display elements has a second shape, size or surface characteristic. The substrate may have a first plurality of receptor locations and a second plurality of receptor locations, having first and second complementary shape, size or surface characteristics, respectively. The method of forming a display may include introducing a first set of display elements each having a first shape, size or surface characteristic and including a light-modulating element of a first type onto a substrate, as shown at step 152. At step 154, relative motion is induced between the display elements in the first set and the substrate. The motion may be sufficient to cause at least a portion of the display elements in the first set to distribute into a first plurality of receptor locations on the substrate. At step 156, display elements in the first set that have not distributed into receptor locations in the first plurality of receptor locations are removed from the substrate. A second set of display elements having a second shape, size or surface characteristic and including a light-modulating element of a second type is then introduced onto the substrate at step 158. At step 160, relative motion is induced in the display elements in the second set and the substrate. The motion may be sufficient to cause at least a portion of the display elements in the second set to distribute into a second plurality of receptor locations on the substrate. At step 162, display elements in the second set that have not distributed into receptor locations in the second plurality of receptor locations are removed from the substrate. Finally, at step 164 display elements distributed into receptor locations on the substrate are connected to the substrate.

Design of display elements and substrate for constructing self-assembling display element arrays may include designing substrates to operate in cooperation with display elements. Display elements may be attached to the substrate, or, in some embodiments, may simply rest upon and be supported by the substrate. The substrate may have a surface characteristic or property that interacts with a surface characteristic of at least some of the display elements to influence the orientation of display elements on the surface or distribution of display elements on the surface. Surface characteristics that may influence the orientation of display elements may include, but are not limited to, electrostatic or magnetostatic charge, surface energy, magnetic, shape or texture characteristics. The surface characteristic may be the binding affinity of one or more organic molecules and specifically biomolecules, coated on or adhered to the surface. The substrate may include electrical circuitry and contacts for sending power or data signals to one or more display elements disposed on its surface. The substrate may include optical circuitry and optical connections to display elements on its surface. Choice of substrate is strongly dependent on the intended application of the display element array, though general design principles apply to substrate and display elements across applications.

In some embodiments, the substrate may include a planar surface. At least a portion of the receptor locations may be receptor locations formed in the planar surface. In other embodiments, the substrate may include a non-planar surface. The substrate may include a plurality of address lines, and each display element of the plurality of display elements may be independently addressable through one or more of the plurality of address lines. Characteristics of the receptor locations and display elements may include shape and or surface characteristics, including, for example, one or more of charge characteristics, surface energy characteristics, or electrical or magnetic characteristics.

Display elements used in various embodiments may be made up of one or more light-modulating elements, and a carrier which houses, supports, contains, or surrounds the light-modulating element(s). A display element suitable for assembly into multicolor displays having a plurality of elements may include a light-emitting element capable of emitting light in respective spectral range corresponding to one or more of the colors of the display and a carrier in which the light-emitting element is housed. The carrier may be characterized by at least one surface, shape or size characteristic, or a combination of shape, size and surface characteristics. Self-assembly of display elements into corresponding receptor locations may be based upon variations in a single characteristic (e.g., only size, only surface charge, etc.) or it may be based upon a combination of shape, size, and/or surface characteristics. The carrier thus provides the surface, shape or size characteristics that are characteristic of the display element. The carrier may have defined shape, size or surface characteristics, selected to preferentially locate the display element with respect to other display elements on the substrate in a desired color pattern to form a multicolor display.

Various types of display elements may be used in the different embodiments. Display elements may include light-emitting elements in some embodiments. In some embodiments, display elements may include other forms of light-modulating elements having light spectral characteristic, and not limited to light-emitting elements. For example, other types of display elements may absorb, reflect, diffract, scatter, fluoresce, or otherwise modify light impinging on the display to provide a particular visually detectable effect on the display, in which case display elements have a characteristic light absorption spectrum, light reflection spectrum, etc., instead of or in addition to a light emission spectrum.

Display elements may be distinguished from each other by various characteristics, of which the following are only exemplary: intensity of emitted light, power consumption, size, shape, wavelength band envelope, spectral width, spectral content, power, intensity, brightness, irradiance, emission pattern, direction of emission, polarization, response speed, and linearity. Moreover, display elements may have a characteristic spectral response that is not based upon light emission, but rather upon some form of light modulation, including, but not limited to, light reflection, refraction, absorption, or scattering. Display elements may include various types of light-emitting or -modulating elements. Each type of light-emitting element may be capable of emitting light in a respective wavelength band. Light-emitting elements may be, for example, inorganic wavelength converters, organic wavelength converters, phosphors, fluors, laser diodes, light-emitting diodes, organic light-emitting diodes, polymer light-emitting diodes, quantum dots, polymers, polymer, electroluminescent devices, chemiluminescent devices, or nonlinear optical materials. Each display element may include a polymeric carrier or a silicon-based carrier. Light-emitting elements may be capable of emitting light in a wavelength band corresponding to one or more colors, responsive to a control signal. Light-modulating elements may include structures including nematic crystals and polarizers, such as those found in LCDs, photoabsorptive materials, MEMS structures, optical polymers, or other types of elements that can vary the amplitude, polarization, color content, pulse-duration or pulse-format, overall energy or other aspects of the light.

In some embodiments, a display may include display elements including two different light-emitting elements that emit light in the same general wavelength band, for example two light-emitting elements that emit red light: one emitting light in a narrow wavelength band and one emitting light in a broad wavelength band. Display elements in the first set may include light-emitting elements that emit light that differs from light emitted by light-emitting elements in display elements in the second set by one or more parameters including wavelength band envelope, spectral width, power, emission pattern, polarization, response speed, or linearity.

Association and/or assembly of display elements with respect to receptor locations on a substrate, and, in some cases, with other display elements, may be dependent on macro and microscale shape and surface properties. Shape characteristics such as concavities, convexities, or various combinations thereof may be used to promote self-assembly, as described in U.S. Pat. No. 6,507,989; Srinivasan et al., J. Microelectromechanical Systems, Vol. 10, No. 1, pp. 17-24, March 2001; Zheng et al.; Proc. Natl. Acad. Sci., Vol 101, No. 35, pp. 12814-12817, Aug. 31, 2004; and Whitesides and Grzybowski, Science Vol. 295, pp. 2418-2421, Mar. 29, 2002; all of which are incorporated herein by reference. Other configurations that may promote self-assembly alone or together with other properties herein include overall size, other geometrical aspects, or weight distributions, or other physical variations. Surface characteristics that promote self-assembly include but are not limited to charge or surface energy properties, electric or magnetic properties, or binding affinities, as discussed in Bowden et al., J. Am. Chem. Soc., Vol. 121, pp. 5373-5391, 1999. and Srinivasan et al., J. Microelectromechanical Systems, Vol. 10, No. 1, pp. 17-24, March 2001; both of which are incorporated herein by reference. Such properties may be conferred on a surface by molecules bound or otherwise adhered or applied to the surface. Properties that have an effect at the surface may also be internal properties of a display element; e.g., a surface magnetic field may be produced by magnetized structures within a display element. Molecular structures may promote association or interactions including charge interactions, hydrogen bonding, molecular bonding, or other molecular interactions. The surface may, for example, be coated with organic molecules and specifically with biomolecules having specific binding affinities. Selective interactions of biomolecules to other biomolecules or to non-biological molecules including, but not limited to, base pairing of complementary nucleic acid/nucleotide sequences, amino acid and/or protein-protein interactions, saccharide sequence or glycoprotein interactions, antibody-antigen interactions, and combinations thereof, may be employed in some embodiments, as described in Montemagno and Bachard; Nanotechnology, Vol. 10, pp. 225-231, 1999; Chung et al., Small, Vol. 1, pp. 1-5, 2005; and Jakab et al., Proc. Natl. Acad. Sci. Vol 101, No. 9, pp. 2865-2869, Mar. 2, 2004, all of which are incorporated herein by reference. For the purpose of promoting self-organization, interactions or associations between display elements and receptor locations on a substrate may range from relatively weak to relatively strong interactions or associations. Individual display elements may have both distinctive shape and surface properties selected to promote the formation of preferred associations with receptor locations and/or display elements with a degree of preference that depends upon the type of display element. Methods of assembling display elements to receptor locations on a substrate may include controlling an environmental condition to promote distribution of display elements to desired receptor locations on the substrate.

According to one preferred embodiment, display elements may have a respective shape, size or surface characteristic and include a light-emitting element capable of emitting light of a characteristic wavelength band. The respective shape, size or surface characteristic is adapted to cause each display element to associate with receptor locations on the substrate with a degree of preference that depends upon the type of display element. In certain embodiments, display elements have one or more respective shape, size or surface characteristics that are selected to provide a relatively lower preference for receptor locations of certain types and higher preference with receptor locations of other types.

The display element may include one or more inputs for receiving power and/or control signals. For example, the display element may include at least one contact for forming an electrical or optical connection with a substrate or another display element to receive power or control signals. In some embodiments, the display element may include a radio transmitter and/or receiver for sending or for receiving an RF control or data signal. The display element may include a power signal input that may be, for example, a receiver coil or antenna for receiving electromagnetic power. In some embodiments, display elements may include various other structures that convert energy or power received from external sources to light, including, for example, photovoltaic, fluorescent, and chemoluminescent devices. In some embodiments, the display element may include a power source, which may be a battery or other power-generating, -collecting, -transducing or -accumulating device or structure, such as a photovoltaic cell, an inductive coil, an antenna, or an energy-scavenging device.

Control signals for controlling generation or modulation of light by a display element may be transmitted to display elements via the substrate or one or more adjacent display elements via data-links such as acoustic, optical, magnetic or electrical links. Display elements may include a transceiver that allows data and control signals to be sent between display elements and external control circuitry, without electrical connections between display elements. Display elements may be responsive to control signals in the form of electrical or electromagnetic energy (e.g., UV light or an electron beam) targeted on the display element. Display elements may emit light in response to an electrical control signal (e.g., current or voltage), an electromagnetic control signal (e.g., an electron beam or incident light), or other control signal. A display element may emit light in response to a control signal. In some embodiments, a display element may turn off in response to the control signal, while in still other embodiments, the pattern of light emission or modulation produced by a display element may be modulated by a control signal; e.g., the amplitude or pulse frequency of emitted light may be modified in response to a control signal.

Each display element may include a unique identifier. Each display element may be capable of storing identifying information. The unique identifier may be a number or code stored in various formats detectable or readable by external devices and/or by other components within the display. For example, the unique identifier may be an RFID or other type of electromagnetically responsive element. The unique identifier may be a pattern of bits stored in any of various types of data storage elements in or on the display element, for example, in electronic, optical, or magnetic form. In some embodiments, the identifying information may be updatable, for example, by circuitry on the display element, by a control signal sent from the substrate, or by a control signal sent from a location remote from the substrate. The identifying information may include address information specifying the location of the display element on the substrate.

According to various embodiments, display elements include a carrier which contains or surrounds one or more light-modulating elements and may confer upon the display element its shape, size or surface characteristics. The carrier may include a polymeric material or a semiconductor material. The light-modulating element may be formed integrally with the carrier or may be formed separately from the carrier and subsequently embedded in the carrier. The carrier may include at least one shape, size or surface characteristic, which may include a binding affinity of an organic molecule and specifically a biomolecule (including but not limited to binding or interactions of one or more of an amino acid sequence, saccharide sequence, nucleic acid sequence, protein, or glycoprotein, and combinations thereof), a surface energy characteristic, or an electric or magnetic characteristic. The carrier may include an electric or a magnetic characteristic complementary to an electric or a magnetic characteristic of a respective receptor location. The shape or surface characteristic of the carrier may include a surface electric or magnetic signature complementary to a surface electric or magnetic signature of a corresponding receptor location.

The carrier may include at least one control signal input, which may include an electrical contact. Alternatively, the control signal input may include an optical or an acoustic connection. The carrier may include a radio receiver or transceiver for receiving an RF control signal. It may also include a power input, which may include, for example, an electrical contact or a coil or antenna for receiving an electromagnetic power signal. The carrier may include one or more of a battery, a receiver, a transmitter, an analog or analog-digital hybrid power-control device, or a microprocessor.

Formation of display elements may include multi-step processes, including a separate step of applying or forming a surface characteristic on one or more selected regions of the carrier. This step may be performed before or after the carrier and light-modulating element have been joined together. Methods of applying or forming surface characteristics may themselves be multi-step processes (e.g., methods of attaching biomolecules to surfaces as referenced in Montemagno and Bachard Nanotechnology, Vol. 10, pp. 225-231, 1999; Chung et al., Small, Vol. 1, pp. 1-5, 2005; Published U.S. Patent Application US 2004/0023414. A1; and U.S. Pat. No. 6,809,196, all of which are incorporated herein by reference).

In some embodiments, a method of designing displays includes selecting a set of light-emitting elements, each of which is capable of emitting light of respective selected wavelength, determining a preferred arrangement of the light-emitting elements, and designing a substrate having corresponding receptor locations in a pattern or configuration selected to cause display elements to assemble onto the substrate in the preferred arrangement. It should be noted that, while reference is made to "light-emitting" elements, in some embodiments, elements which modify light in some other way to produce a visually-detectable effect (e.g., by light reflection, refraction, or absorption or via fluorescence or other type of frequency-conversion) may be used in place of light-emitting elements. The preferred arrangement specifies the position of light-emitting elements capable of emitting light of each of said selected wavelength bands relative to light-emitting elements capable of emitting light of other selected wavelength bands. Designing displays further includes designing an attribute set for each display element, where each attribute set is adapted to promote self-assembly of the display elements onto their respective receptor locations on the substrate, according to the preferred arrangement. The set of display elements according to the method may include a plurality of types of light-emitting elements, in which each type of display element is characterized by a respective attribute set and is capable of emitting (or modulating) light of a respective selected wavelength band. Each display element type may include a light-modulating element capable of emitting (reflecting, diffracting, scattering, etc.) light in a respective wavelength band, and each display element type may be characterized by a respective shape, size, or surface characteristic. In some embodiments, each display element type may have a different respective combination of shape, size, and surface characteristic, than each other display element type.

The preferred arrangement of display elements in the display element array may include a pattern having short-range order, a repeating pattern, or a pattern having long-range order. Patterns having either short-range order or long-range order may incorporate repeating patterns. In an embodiment particularly suited for the design of three-color displays, such as are commonly used in television or computer screens, three distinct types of display elements may be used. A repeating pattern unit may include at least one red display element, at least one green display element, and at least one blue display element.

In some exemplary embodiments, a display element set may include a first set of light-emitting portions having a first wavelength response and a first set of body portions, each carrying a respective one or more of the light-emitting portions in the first set of light-emitting portions. Each body portion in the first set of body portions may have a first defined physical feature corresponding to the first wavelength response. The set of display elements may also include a second set of light-emitting portions having a corresponding second wavelength response and a second set of body portions, each carrying a respective one or more of the light-emitting portions in the second set of light-emitting portions. Each body portion in the second set of body portions may have a second defined physical feature corresponding to the second wavelength response. The first defined physical feature is configured to preferentially associate with a first receptor location type on a substrate, and the second defined physical feature is configured to preferentially associate with a second receptor location type on the substrate.

Figure 12:
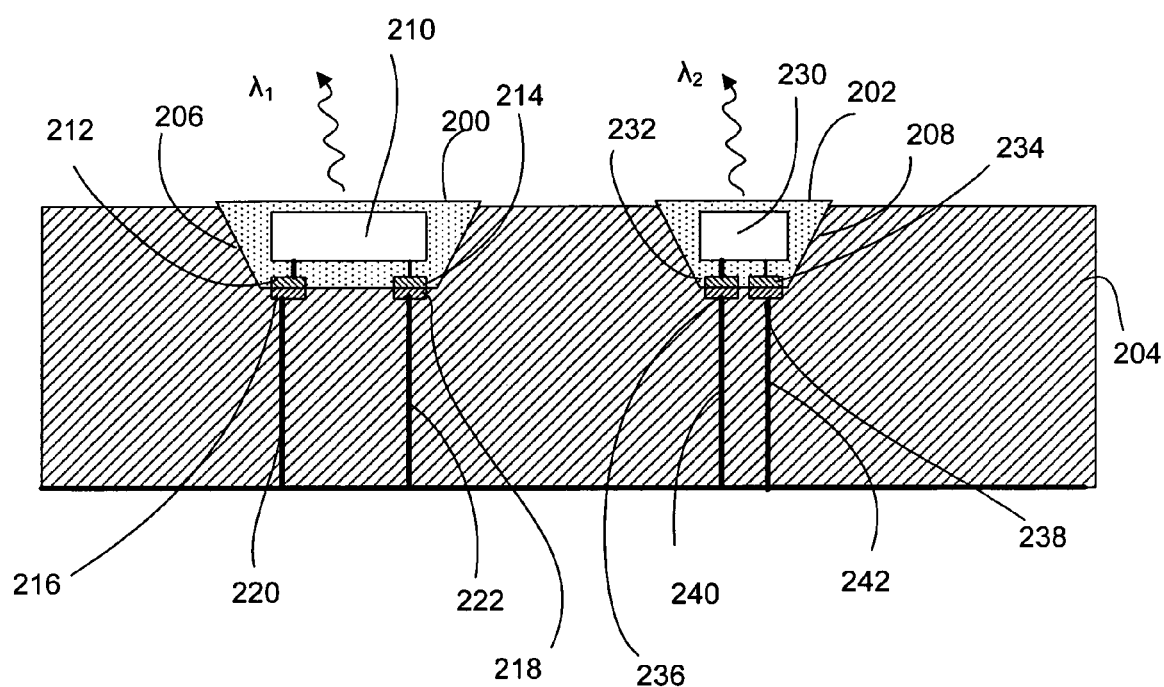
FIG. 12 depicts two display elements mounted in receptor locations on a substrate.

FIG. 12 illustrates one exemplary method of connecting display elements to a substrate and providing signals for activating the display elements. A first display element 200 and a second display element 202 are mounted in substrate 204 in first receptor location 206 and second receptor location 208, respectively. In this example, first receptor location 206 and second receptor location 208 are recessed regions or receptacles formed in substrate 204. Display element 200 includes light-emitting element 210. Contacts 212 and 214 in display element 200 provide for the delivery of power and control signals to light-emitting element 210. Contact 212 and contact 214 form connections with contacts 216 and 218, respectively, which are formed in receptor location 206 and connected to power line 220 and control line 222. Similarly, display element 202 includes light-emitting element 230 and contacts 232 and 234, which provide for the delivery of power and control signals to light-emitting element 230. Contact 232 and contact 234 form connections with contacts 236 and 238, respectively, which are formed in receptor location 208 and connected to power line 240 and control line 242.

The distribution of specific types of display elements in the display element array may be determined by the distribution of corresponding receptor location on the substrate, e.g., specific types of receptor locations may be distributed in a regular and/or repeating pattern, as depicted in the embodiment of FIG. 1. In several previously described embodiments, receptor locations on the substrate are recessed regions or receptacles having a size, shape or surface characteristic matched to the shape, size or surface characteristic of a corresponding type of display element. The receptor locations may be spaced apart from each other so that there is no contact between adjacent display elements. In other embodiments, receptor locations may be located immediately adjacent to each other. In some embodiments, display elements and substrate may be configured so that it is possible to form connections between display elements positioned in adjacent receptor locations.

Figure 13:
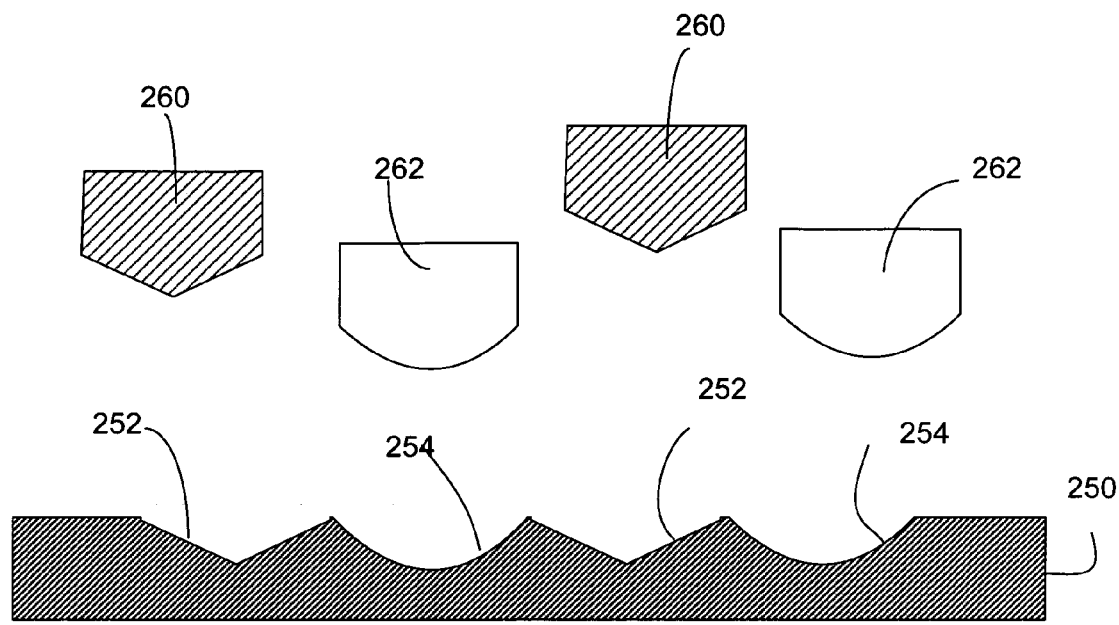
FIG. 13 illustrates a substrate having multiple receptor locations and corresponding display elements.
Figure 14:
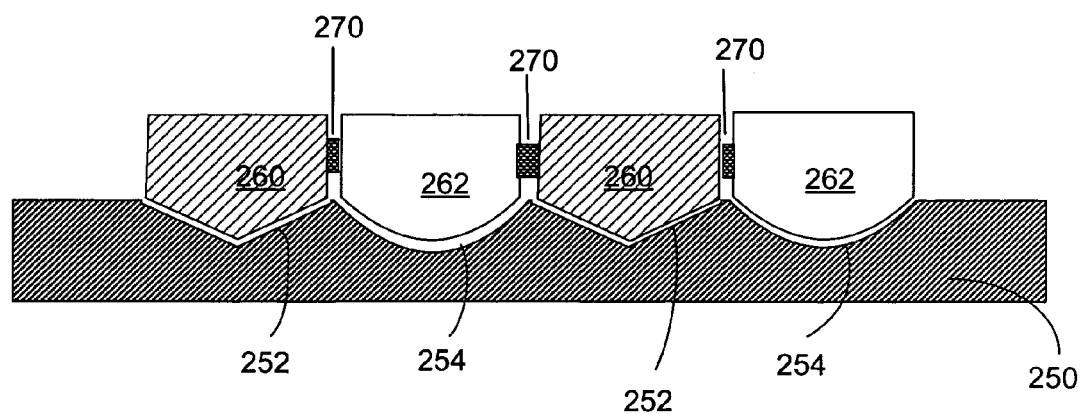
FIG. 14 illustrates the display elements of FIG. 13 mounted on receptor locations on the substrate of FIG. 13.

FIGS. 13 and 14 illustrate an exemplary embodiment in which display elements are located immediately adjacent to each other. In FIG. 13, substrate 250 includes first receptor location type 252 and second receptor location type 254, which are designed to receive first display element type 260 and second display element type 262, respectively. FIG. 14 depicts display elements 260 and 262 mounted in respective receptor locations 252 and 254 in substrate 250. Also depicted are connections 270 between adjacent display elements. Connections between adjacent display elements may provide mechanical strength and/or rigidity, may provide for the transfer of thermal energy for heating or cooling, e.g., to provide a desired thermal environment, or may be electrical or optical connections that permit the transfer of information, control or power signals between display elements.

In some embodiments, receptor locations may not be recessed areas. Receptor locations may be regions on a substrate surface having a particular surface characteristic or property. Association of display elements may be based upon surface interaction rather than upon matching of size or shape characteristics. In other embodiments, matching of display elements to receptor locations may be based upon a combination of size, shape and surface characteristics or properties. For example, the interior of a recessed receptor location may include a coating which confers surface characteristics on the receptor location that enhance assembly of a specific display element at or onto the receptor location. The display element may have combined size, shape and surface characteristics complementary to the size, shape and surface characteristics of the corresponding receptor location.

In some embodiments, display elements may be held in fixed spatial relationship with respect to the substrate by one or more connections between the display elements and substrate. Connections between the display elements and the substrate may provide structural or mechanical stability or rigidity. They may also provide electrical, optical, acoustic, magnetic or other connections that provide for the transfer of data, power, or control signals. Connections between display elements and substrate may conduct thermal energy, thus providing a heat sink, cooling, or heating, e.g., in order to provide a desired thermal environment. Control and power signals may be transmitted to display elements by various means, including wireless transmissions, and assembly of display elements into arrays may be a separate process from the formation of control links to display elements. In some cases, direct physical connections between display elements may not be required to provide for the transmittal of power or control/data signals, and may only provide mechanical support and/or spatial positioning and/or orientation.

Connections between display elements and the substrate may be rigid or flexible. In some embodiments, mechanical connections may provide strength and structural integrity to the assembled array as a whole. Display element arrays for use in television screens or computer monitors may be formed on rigid and substantially planar substrates. However, in some applications of display element arrays, it may be desirable for display element arrays to be formed on flexible substrates. Display element arrays formed on non-planar rigid or semi-rigid substrates may be used in some embodiments.

In some cases, the interaction between display elements and substrate used to produce self-assembly of display elements may be sufficiently strong that display elements will be joined securely to the substrate without any further connection being provided between the display elements and substrate. In many cases, however, the association of display elements may not provide sufficiently secure connection of the display elements for the intended application. In such cases, display elements and substrate may be connected together by various methods. Mechanical connections may be formed through the use of various adhesives, including self-fusing adhesives, similar to or including self-fusing silicone adhesives, an example of which is 3M® Scotch™ Self-Fusing Silicone Rubber Electrical Tape. They may also be formed by causing the material of the display elements and substrate to fuse or adhere together, e.g. by electrostatic or magnetostatic attraction means. Such fusing or adhesion could be produced by applying heat, light or other radiation (e.g., to produce a photochemical reaction), chemical treatment, pressure (for example, either steady or intermittent pressure, or ultrasonic pulses) to form connections between display elements. Such connections may be based on melting or sintering of display element materials, chemical bonding, cross linking, and various other processes, as known to those of skill in the relevant arts, exemplified by Gracius et al., Science, Vol. 280, pp. 1170-1172, Aug. 18, 2000. and Zheng et al.; Proc. Natl. Acad. Sci., Vol. 101, No. 35, pp. 12814-12817, Aug. 31, 2004, both of which are incorporated herein by reference.

In some embodiments, display elements may be held in fixed spatial relationship with respect to other display elements by direct connections between adjacent display elements, in addition to or instead of by connection of display elements to a substrate. Connections between display elements may provide structural or mechanical stability or rigidity. They may also provide electrical, optical, or other connections that provide for the transfer of data, power, or control signals between display elements and other display elements and/or a substrate. Connections between display elements may conduct thermal energy, thus providing a heat sink, cooling, or heating. Mechanical connections between adjacent display elements and between display elements and substrate may be formed by adhesives of various types, depending on the material(s) used in the display elements. Mechanical connections may also be formed by causing the material of the display elements themselves to bond or adhere together. Such bonding or adhesion could be produced by applying heat, chemical treatment, pressure (for example, either steady or intermittent pressure, or ultrasonic pulses) to form connections between display elements. Such connections may be based on melting or sintering of display element materials, chemical bonding, cross linking, and various other processes, as known to those of skill in the relevant arts. Electrical, magnetic, acoustic or optical connections may require the alignment of contact regions (which may occur simultaneously with self-organization of display elements to receptor locations) and formation of an electrical or optical connection, by suitable processes as listed above or other processes known to those of skill in the relevant arts. Electrical connections may permit the transmittal of control, data, and/or power signals. In some embodiments, connections between display elements may include one or more optical, magnetic, or acoustic connections between display elements for the transmittal of control or data signals. Mechanical connections between display elements may be formed by adhesives of various types, depending on the material(s) used in the display elements. Electrical or optical connections may require the alignment of contact regions (which may occur simultaneously with self-organization of display elements) and formation of an electrical or optical connection, by suitable processes as listed above or other processes as will be known to those of skill in the relevant arts, such as conductive epoxies, mating metal surfaces or solder reflow.

According to certain embodiments, securing display elements distributed to receptor locations on a substrate in fixed relationship with respect to each other may be achieved by securing the display elements with respect to the substrate. In some embodiments, display elements distributed to receptor locations on the substrate may be secured in fixed relationship with respect to each other by securing each display element with respect to at least one other display element. In some embodiments, connections may be established for delivering control signals to drive emission of light by the secured display elements by forming a contact between each secured display element and electronic circuitry on the substrate. Connections for delivering control signals to drive emission of light by the secured display elements may be established by forming a wireless link between each secured display element and a remote driver. A wireless link may be established, for example, by sending an activation signal keyed to a unique identifier for each secured display element, with the unique identifier being associated with a location of the secured display element. Alternatively, a wireless link may be established by sending an activation signal keyed to a specific location for each secured display element. The method may include providing a control signal to each secured display element to test the function of the secured display element.

Connecting display elements to the substrate may include applying heat or light to the display elements, the substrate, or a binder contacting the display elements, applying pressure to the display elements, or chemically, radiantly or electromagnetically treating the display elements.

Figure 15:
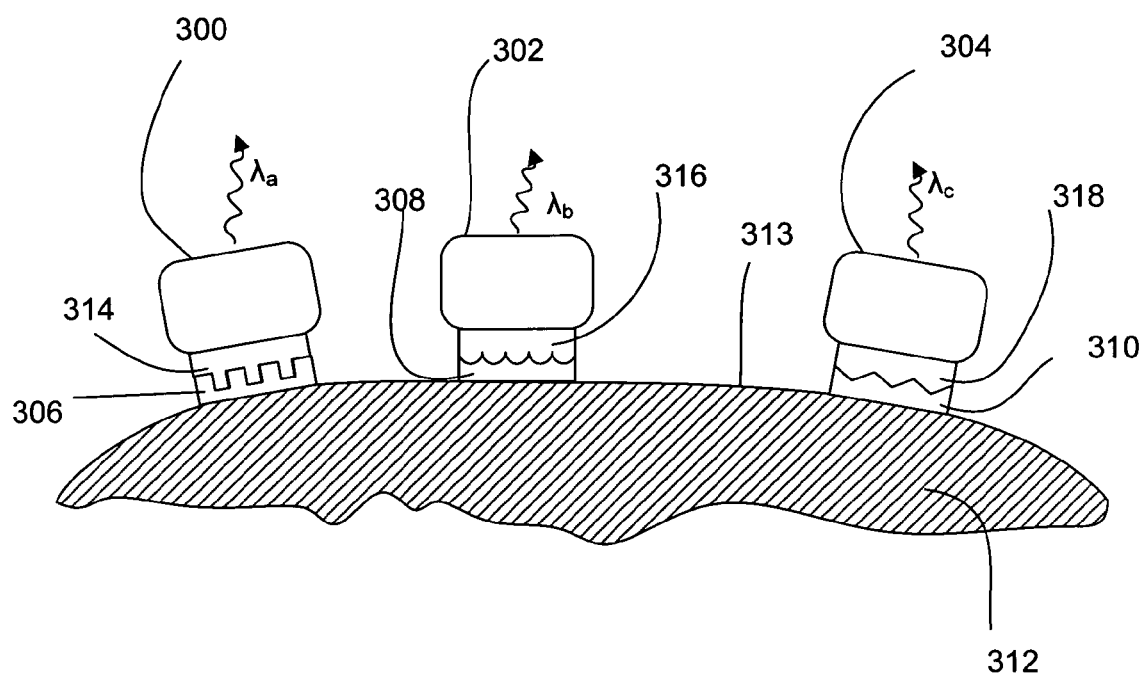
FIG. 15 illustrates several types of display elements attached to corresponding receptor locations on a substrate.

FIG. 15 illustrates several display elements 300, 302, and 304 attached to a respective receptor site 306, 308, and 310 on substrate 312. In this exemplary embodiment, receptor sites 306, 308, and 310 are regions on surface 313 of substrate 312, having respective distinct surface characteristics. Display element 300 includes a surface region 314 that is complementary to region 306 on surface 313, display element 302 includes a surface region 316 that is complementary to region 308 on surface 313, and display element 304 includes a surface region 318 that is complementary to region 310 on surface 313. Regions 306, 308, and 310 and complementary surface regions 314, 316, and 318, are depicted in schematic form in FIG. 15, not intended to illustrate any specific surface properties, but merely to indicate different complementary surface properties. Complementary surface properties may include, but are not limited to, one or more of surface electric charge, surface energy, magnetic properties, binding affinity of organic molecules and specifically biomolecules (e.g., complementary nucleic acid sequences, protein, glycoprotein, amino acid or saccharide interactions, antibody-antigen interactions, etc.).

Figure 16:
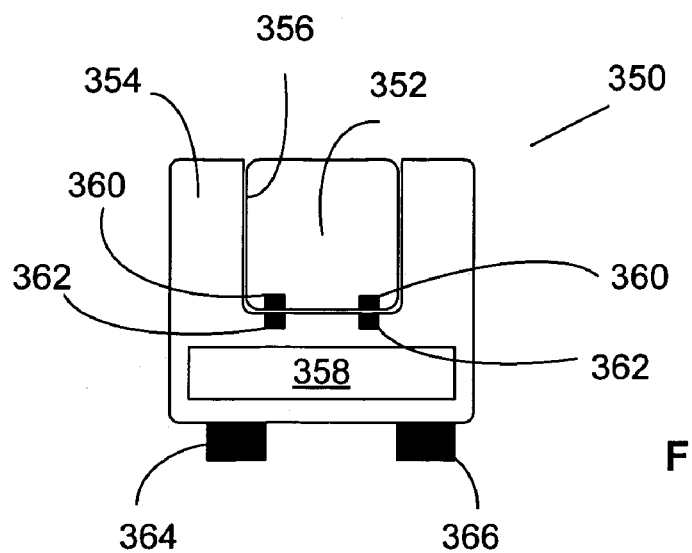
FIG. 16 depicts exemplary embodiment of a display element.
Figure 17:
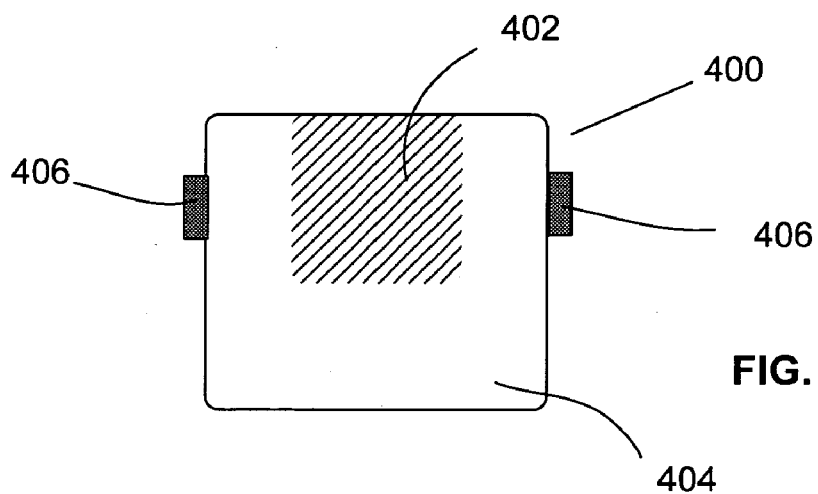
FIG. 17 depicts another exemplary embodiment of a display element.
Figure 18:
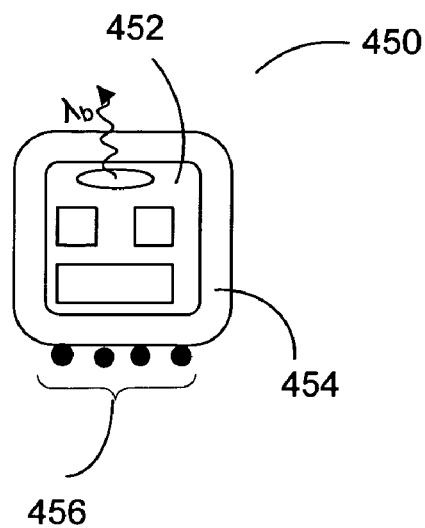
FIG. 18 depicts another exemplary embodiment of a display element.

FIGS. 16-18 illustrate several exemplary display elements. In the embodiment shown in FIG. 16, display element 350 includes light-emitting element 352 and carrier 354. Carrier 354 may include recess 356 into which the light-emitting element 352 is placed subsequent to manufacture of the light-emitting element and the carrier, as shown in FIG. 16. In this embodiment, display elements 350 include electronic circuitry 358. Power and control signals may be delivered to display element 350 from a substrate on which it is mounted, via contacts 364 and 366. As depicted in FIG. 16, light-emitting element 352 may be formed separately from carrier 354. Light-emitting element 352 fits into recess 356 in carrier 354, where contacts 360 on light-emitting element 352 and contacts 362 in recess 356 form a connection by which signals used to activate light-emitting element 352 to produce light can be delivered. Light-emitting element 352 and carrier 354 may be produced by standard fabrication techniques including, for example, injection molding of a plastic body around a semiconductor-based light-emitting element.

FIG. 17 depicts an alternative embodiment of a display element 400 in which light-emitting element 402 is formed integrally with carrier 404. Carrier 404 may be a silicon structure in which semiconductor-based electronic circuitry has been formed. Light-emitting element 402 may be, for example, a light-emitting diode or laser diode, either of which can be formed in an integrated semiconductor device. Contacts 406 may provide for the transmission of power and/or control signals between display element 400 and a substrate or adjacent display element. In the embodiments of FIG. 17, the light-emitting element is formed integrally with the carrier and no clear distinction can be made between display element, light-emitting element, and carrier, the carrier feature of the display element residing in the surface characteristic of the external portion. The body-forming material may itself include light-emitting properties. For example, all or a portion of the body may be formed from a light-emitting material such as that used in organic LEDs.

In another embodiment, depicted in FIG. 18, a display element 450 may include light-emitting element 452 and carrier 454. Carrier 454 may take the form of a coating applied to the exterior of light-emitting element 452. Carrier 454 may be applied to light-emitting element 452, for example by dipping the light-emitting element 452 into a material that will form carrier 454, by spraying a material that will form carrier 454 onto the light-emitting element, or by other methods known in the art. Carrier 454 may include or be formed of one or more materials with a surface property 456 that promotes self-organization of display element 450 with other display elements.

Figure 19:
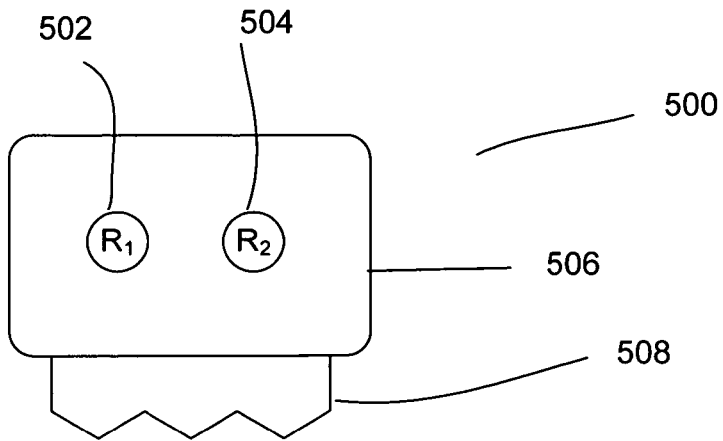
FIG. 19 illustrates a display element including two light-emitting elements.

In certain embodiments, a display element may include multiple light-emitting elements. In the example of FIG. 19, a display element 500 includes two light-emitting (or -modulating elements) 502 and 504, contained within carrier 506. Light-emitting elements 502 and 504 may emit light of the same general color which, however, differs in terms of waveband or other characteristics. For example, light-emitting element 502 may emit broad-waveband red light, while light-emitting element 504 may emit red light in a narrow waveband. Alternatively, light-emitting elements 502 and 504 may be identical light-emitting elements that are included in duplicate to provide redundancy, so that if one light-emitting element fails, the other may serve as a backup. In another alternative, light-emitting elements 502 and 504 may be two identical light-emitting elements such that display element 500 may emit light in a broader range of light intensities than if it included only a single light-emitting element. In still another embodiment, light-emitting elements 502 and 504 may emit light in bands having different central peaks. This may allow greater spectral coverage, or use of less expensive components while still providing light in a usable range. Display element 500 may also include shape, size, or surface characteristics 508 that facilitate self-assembly of display element 500 to a receptor location.

Figure 20:
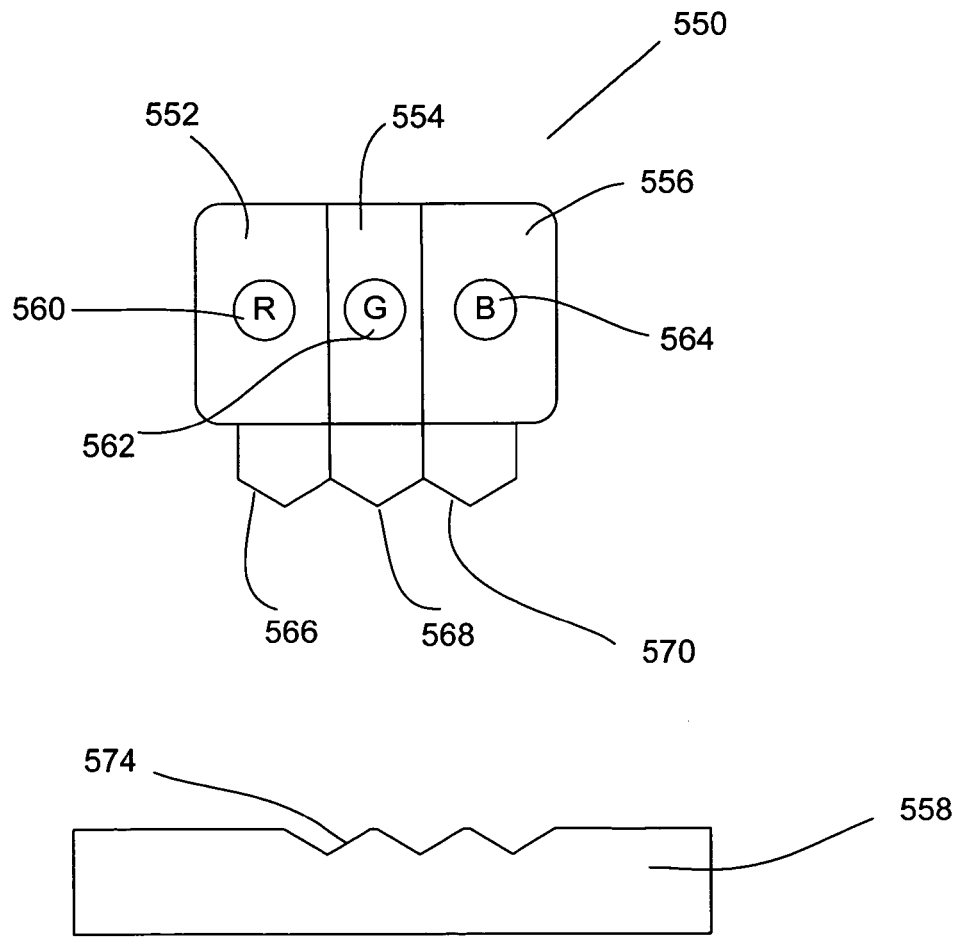
FIG. 20 illustrates a display element formed from three display sub-elements.

In a further embodiment depicted in FIG. 20, display element 550 is made of two or more (in this example, three) sub-elements 552, 554, and 556 that are assembled together prior to assembly of display element 550 to substrate 558. Assembly of display sub-elements 552, 554, and 556 to form display element 550 may be via a self-assembly process or by various other processes, as are known to those of skill in the relevant arts. Sub-elements 552, 554, 556 may include light-emitting elements 560, 562, and 564, respectively, which may be of the same or different types. In one useful combination, for example, light-emitting element 560 may emit light in a red wavelength band, light-emitting element 562 may emit light in a green wavelength band, and light-emitting element 564 may emit light in a blue wavelength band. Other combinations of multiple light-emitting elements may be used to provide redundancy, greater range of intensities, enhanced spectral content, and so forth. Each display sub-element 552, 554, and 556 may include a respective shape, size or surface characteristic 566, 568, 570 that causes display element 550 to distribute to a receptor location 574 on substrate 558. Receptor location 574 may include a shape, size or surface characteristic complementary to the combined shape, size or surface characteristics 566, 568, and 570.

Various of the exemplary embodiments disclosed herein (e.g., in FIGS. 1 and 4-10) include display elements arranged in regular, rectilinear N×N or M×N arrays. However, as used herein, the term "display element array" applies not only to regular, rectilinear arrays, but also to arrays formed from various other arrangements of display elements, including arrangements of display elements that are non-uniform with respect to various parameters, including, but not limited to spacing, orientation, size, and type of display elements. Display element arrays may include two or more distinct regions, configured so that within each region the display element array is regular and uniform, but between regions and across the display element array as a whole, there is a non-uniform, irregular distribution of display elements. Display element arrays may also include arrangements of display elements that are non-uniform overall. Non-uniform distributions may include gradients with respect to display element size, color, etc., for example, running from one side of a display element array to another, or from the center of a display element array to the edges. Non-uniform display element arrays may be non-uniform but have a statistical distribution of display elements over some or all of the array. In certain embodiments, the spatial distribution of display elements over an array may be random or quasi-random.

Figure 21:
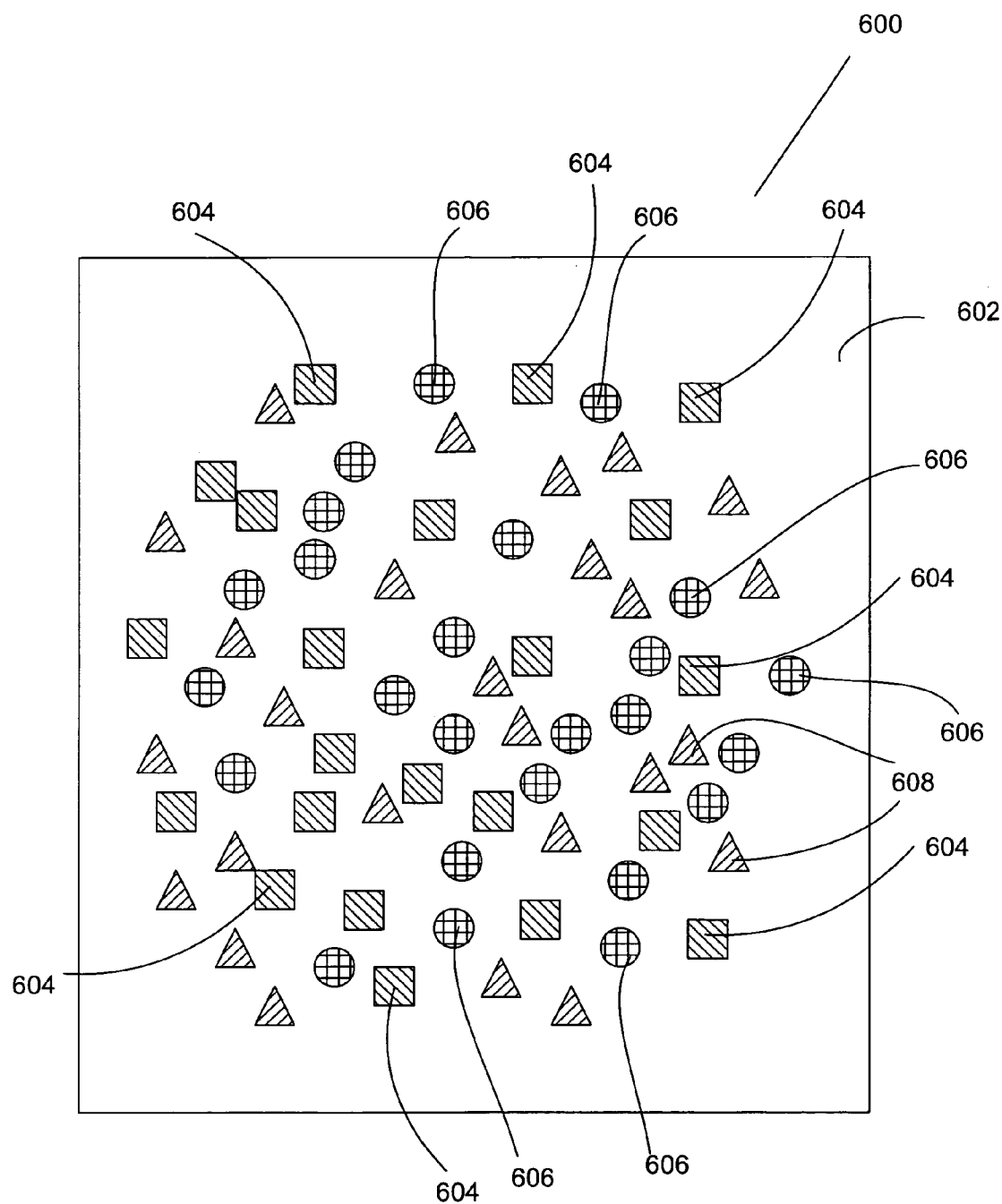
FIG. 21 illustrates a substrate including irregularly distributed receptor locations.

FIG. 21 illustrates an embodiment of a display element array 600 in which receptor locations of three different types 604, 606 and 608 are distributed over substrate 602 in random or substantially random pattern. The distribution of receptor locations may be well-characterized by various statistical measures. For example, the distance between receptor locations of a particular type (e.g., the distance between two receptor locations 604) may follow a normal distribution with a known mean and standard deviation. In other embodiments, receptor locations (and hence display elements in the assembled display element array) may have various distributions, and are not limited to any particular distribution.

Display elements may be responsive to one or more control signals. Control signals may include electrical signals transmitted via electronic circuitry, electromagnetic signals transmitted to display elements via a transmitter and received by a receiver (or transceiver), optical signals delivered via optical circuitry or electromagnetic signal, acoustic signals delivered via various paths, etc. A control signal may produce emission of light by a light-emitting element directly (e.g., in the case of an electron beam, UV beam, or other energy impinging on a phosphor to cause emission of light) or a control signal may be processed by electronic or optical circuitry on the light-emitting element to control light emission indirectly, in which case the control signal may initiate, stop, or otherwise modulate the emission of light by light-emitting elements.

A variety of approaches to selectively activating individual elements, or groups of elements may be implemented. In a straightforward N×N or M×N array of elements, conventional row and column addressing, such as that found in many matrix array structures, such as LCDs, may be appropriate. The control electronics and tradeoffs for such addressing and selective activation are known to those of skill in the art.

The display may include electronic circuitry configured for carrying electrical control signals to selected receptor locations on the substrate to control display elements at the selected receptor locations. The display may also include optical circuitry configured for carrying optical control signals to one or more selected receptor locations on the substrate to control display elements and the selected receptor locations. In some embodiments, the display may also comprise an electromagnetic radiation source or charged particle beam projector, wherein each display element of the plurality of display elements is selectively activatable by directing the radiation source or charged particle beam projector toward the display element to activate the display element. The "radiation source" or charged particle beam projector may include an electron gun or an ultraviolet or infrared radiation source. Display elements may be selectively activatable by electromagnetic energy directed onto the selected display elements at selected locations on the display. Control signals may include electromagnetic energy, e.g., ultraviolet radiation or an electron beam, an electrical signal, an optical signal, an acoustic signal, or various other control signals, as known to those of skill in the relevant art.

In some embodiments, a method of controlling a multi-element display may include transmitting a control signal including an element selection component and an activation signal component to a plurality of display elements of a multi-element display. Each display element may have a unique identifier associated with it. The element selection component may include information identifying at least one selected display element to be controlled by the control signal. The activation signal component may specify a desired operation of the selected display element(s). The control signal may be receivable by all display elements of the plurality of display elements, but capable of producing activation of only the selected display element to produce the desired operation. The identifying information may be an identification code that uniquely identifies the display element. Alternatively, the identifying information may be an address specifying the location of the selected display element in the display. In some embodiments, the control signal may be a wireless control signal sent to the display from a remote location.

Connecting groups of associated display elements or individual display elements to a substrate or to each other may include forming connections for transmitting data or power. Such connections may include electrical, magnetic, optical or acoustic connections. As an alternative to direct physical (mechanical, electrical, or optical) connections, power, data, or control signals may be transmitted to display elements via remote or wireless connections, or by other means as described previously. Display elements may include transmitters, receivers, or transmitter-receiver (transceiver) combinations for sending and/or receiving RF or other signals. Power may be transmitted to display elements by various methods, including inductive coupling or power beaming, as well as via direct electrical connections.

As discussed above, if the substrate includes both power and address lines, then activating selected display elements in the assembled display element array to produce a desired pattern may be performed in a straightforward manner, using addressing schemes as are well known to those of skill in the relevant arts. In other embodiments, the substrate may provide power, but not control signals, to the display elements. Delivery of control signals to provide selective activation of the display elements may be achieved by other means. An exemplary embodiment is depicted in FIG. 22, and corresponding method is shown in FIG. 23, in which selective control of display elements relies upon the performance of a preliminary configuration process.

Figure 22:
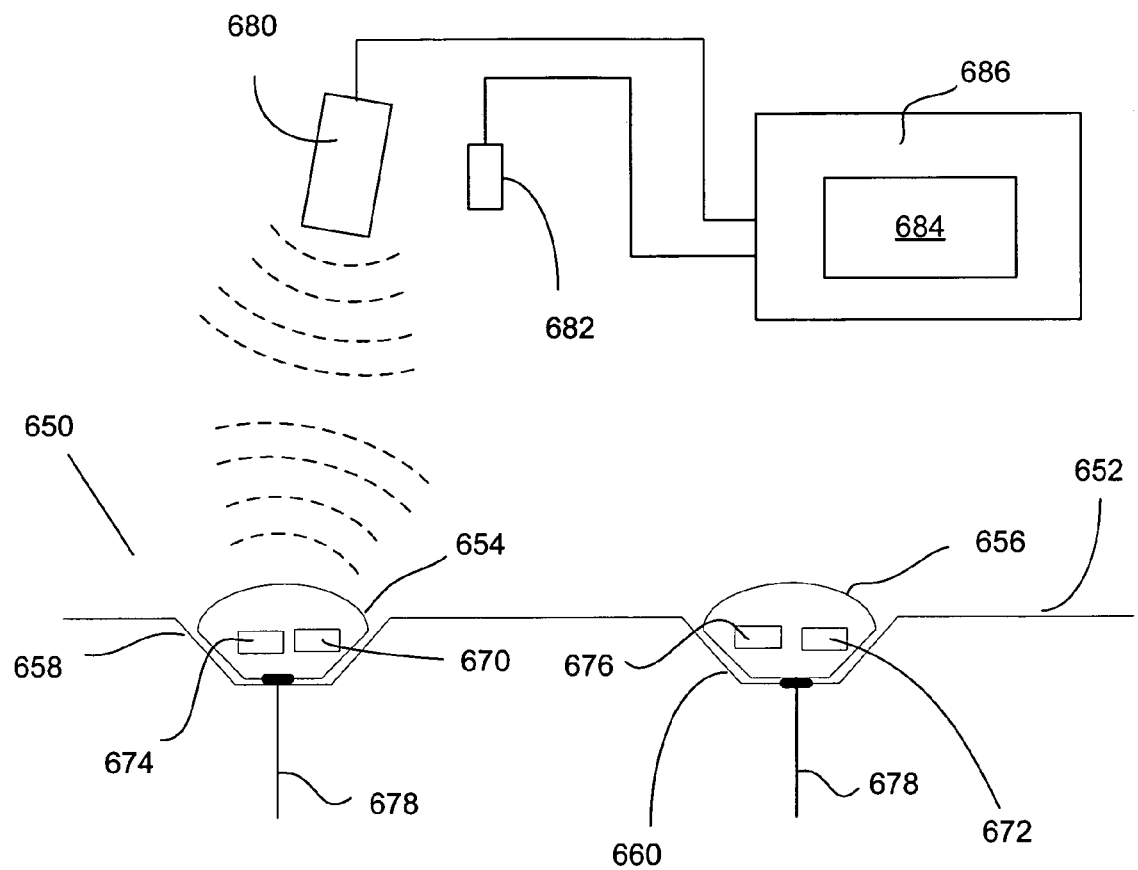
FIG. 22 depicts testing of an assembled display element array.
Figure 23:
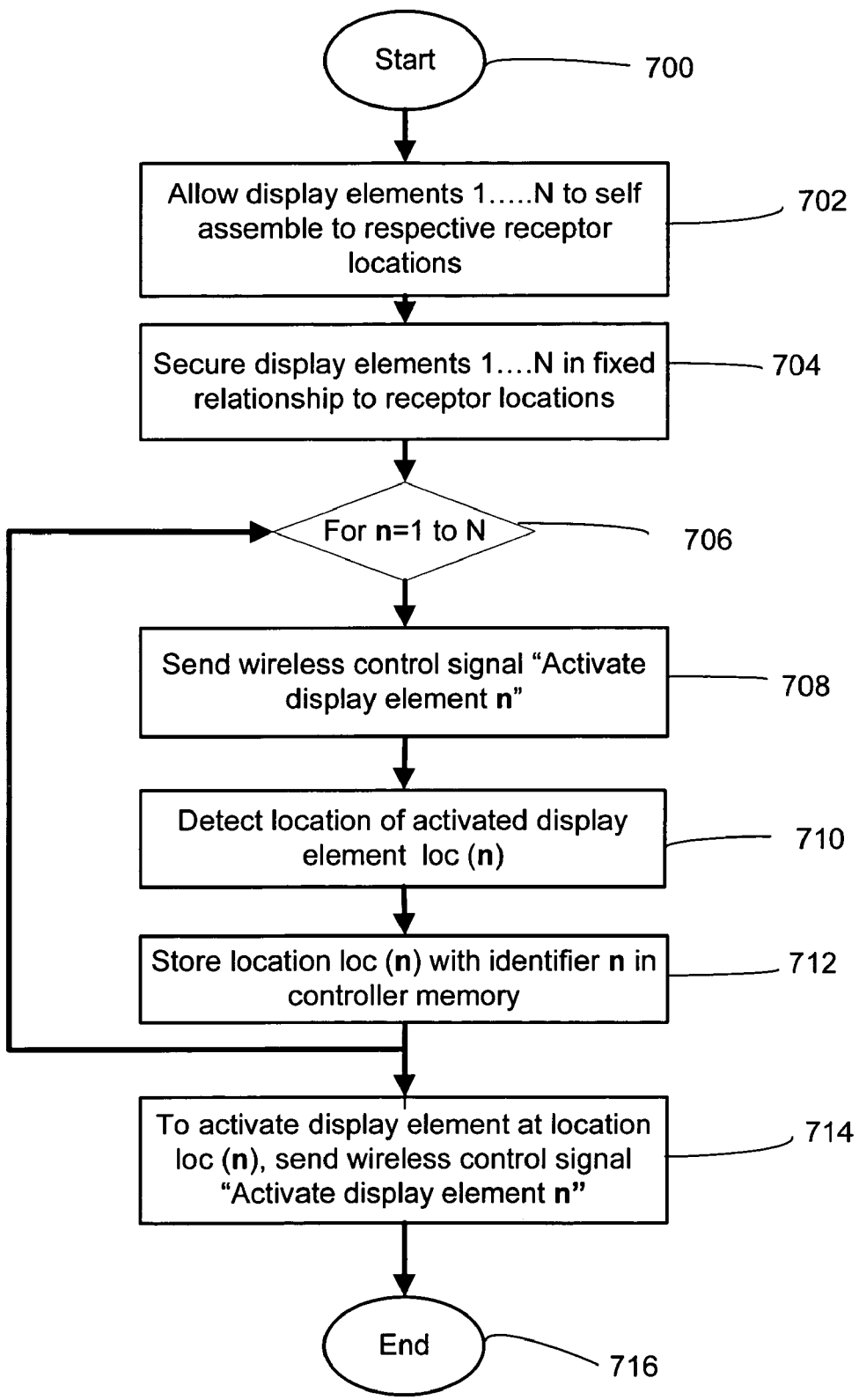
FIG. 23 is a flow diagram of a process for configuring a display element array.

FIG. 22 illustrates a set-up for testing and configuring a display element array 650, which includes substrate 652 and at least two display elements 654 and 656 distributed to receptor sites 658 and 660 in substrate 652. Display element 654 includes an identification tag 670 and logic 674, and display element 656 includes identification tag 672 and logic 676. In the present example, identification tags 670 and 672 are distinguishable from each other and may be uniquely identifiable relative to other display elements in the array 650. In this example, identification tags 670 and 672 may be passive RFID tags responsive to selected patterns of RF radiation. In other embodiments, the identification tags may be active RFID tags, or other devices or structures capable of storing an identification number, code, or other identification information that identifies each display element.

Substrate 652 includes power connections 678, which supply power to display elements 654 and 656. Logic circuitry 674 in display element 654 is configured to activate display element 654 to produce light responsive to an input signal, such as that from an RF transmitter, that matches unique identification tag 670. The identification information relating to each of the display elements may be determined a priori, or may be gathered by systematically interrogating the array 650.

In one approach, under control of microprocessor 684, transmitter 680 generates a series of RF signals coded to various different identifiers. If logic circuitry 674 in the identification tag 670 determines that one of the RF signals matches the identification information in the identification tag 670, the logic circuitry 674 activates the display element 654. Detector 682 detects activation of display element 654 and the identification information corresponding to the identification tag 670 is then stored in memory 684 of microprocessor based device 686. As the process is repeated for each of the RF signals in the sequence, the data in the memory 684 eventually forms a mapping of the identification tags 672 and others relative to their respective identification information. In the future, when activation of a selected display element, e.g., display element 654, is desired, circuitry that drives the resulting display can selectively activate elements by retrieving the corresponding identification information from the memory 684 and transmitting to the selected display element, e.g., element 672, the corresponding RF signal.

Note that, although the process above is described in connection with an exemplary embodiment employing RFID structures, other identification structures may also be appropriate. Electromagnetically responsive elements that are responsive to electromagnetic radiation of various other frequencies, for example, microwave and sub-RF frequencies, may be used as identification structures or tags. Electromagnetically responsive elements for use as identification structure are not limited those that are responsive to any particular frequency range. In other embodiments, each display element may include an optically responsive structure that responds selectively to its respective identification information. In still another approach, each of the display elements may include indicators that are machine-readable or otherwise readily determinable. With use of machine vision or other readily implemented approaches, the relative locations of the display elements may be determined.

FIG. 23 depicts the steps of a process for forming a self-assembled array and establishing the location of specific display elements within the self-assembled array, as described in connection with FIG. 22. This process may be used in systems in which display elements have individual identifiers (e.g., identification codes or numbers) and are controlled by wireless control signals, though modifications of the approach may be applied in systems using other types of connections. The location of specific display elements must be determined after the display elements have self-assembled into their respective receptor locations in the array. At step 702, display elements 1 through N are allowed to self-assemble into their corresponding receptor locations. At step 704, display elements 1 through N are secured in fixed relationship to their receptor locations. Subsequent steps are carried out for display elements 1 to N, as controlled at step 706, or by an equivalent control loop. At step 708, a wireless control signal containing the instruction "Activate display element n" is sent to all display elements, to produce activation of element n. At step 710, the location of activated display element n, designated by loc(n), is detected. At step 712, loc(n) is stored in the memory of a controller, along with the identifier n. Process control returns to step 706, and steps 708 through 712 are repeated for all values of n between 1. and N. When steps 708 through 712 have been repeated for all values of n, training or configuration of the system is complete, and use of the system may commence as represented by step 714. At step 714, a display element at a desired location loc(n) is activated by sending a wireless control signal containing the instruction "Activate display element n." Suitable wireless control signals may be sent out for as long as desired to activate one or more display elements at a time in a desired pattern.

Figure 24:
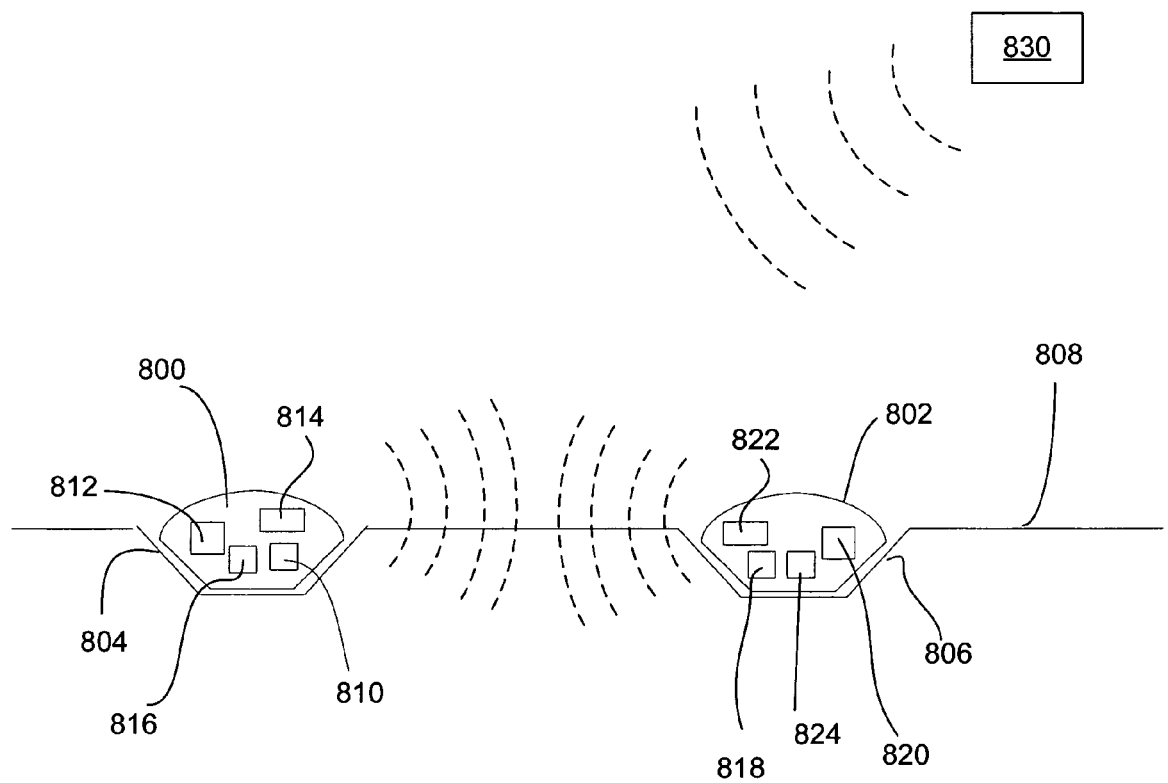
FIG. 24 illustrates a method for configuring a display element array.

FIG. 24 illustrates a further embodiment of an assembled display element array, in which display elements 800 and 802 are assembled into receptor locations 804 and 806 in substrate 808. Display elements 800 and 802 are only two of a larger number of display elements located in substrate 808 but not shown in FIG. 24. In this embodiment, substrate 808 provides mechanical support, but may not contain control or power transmission lines. Display element 800 includes transceiver 810, microprocessor 812, identifier 814, and memory 816. Similarly, display element 802 includes transceiver 818, microprocessor 820, identifier 822, and memory 824. Following self-assembly of display elements 800 and 802 into substrate 808, display elements may transmit identification signals with their respective transceivers 810 or 818 to other display elements, and receive identification signals sent from other display elements. Based upon signal strength, latency, or other distance-dependent variables, the relative position of each display element with respect to other display elements, and hence with respect to the display element array as a whole, may be determined by code run by microprocessor 812 or 820. Location information may be stored in a memory 816 or 824, respectively on display elements 800 and 802. A display control signal containing a location-based element selection component and an activation signal component may be transmitted by a transmitter 830 and received by transceiver 810 and 818. If the element selection component matches the location information stored in the memory of a particular display element, activation of the display element is then controlled in accordance with the activation signal component. The display control methods described in connection with FIGS. 22-24 are merely exemplary, and various other methods known to those of skill in the art of controlling self-assembled display element arrays may be developed and used in connection with display element arrays as disclosed herein.

Figure 25:
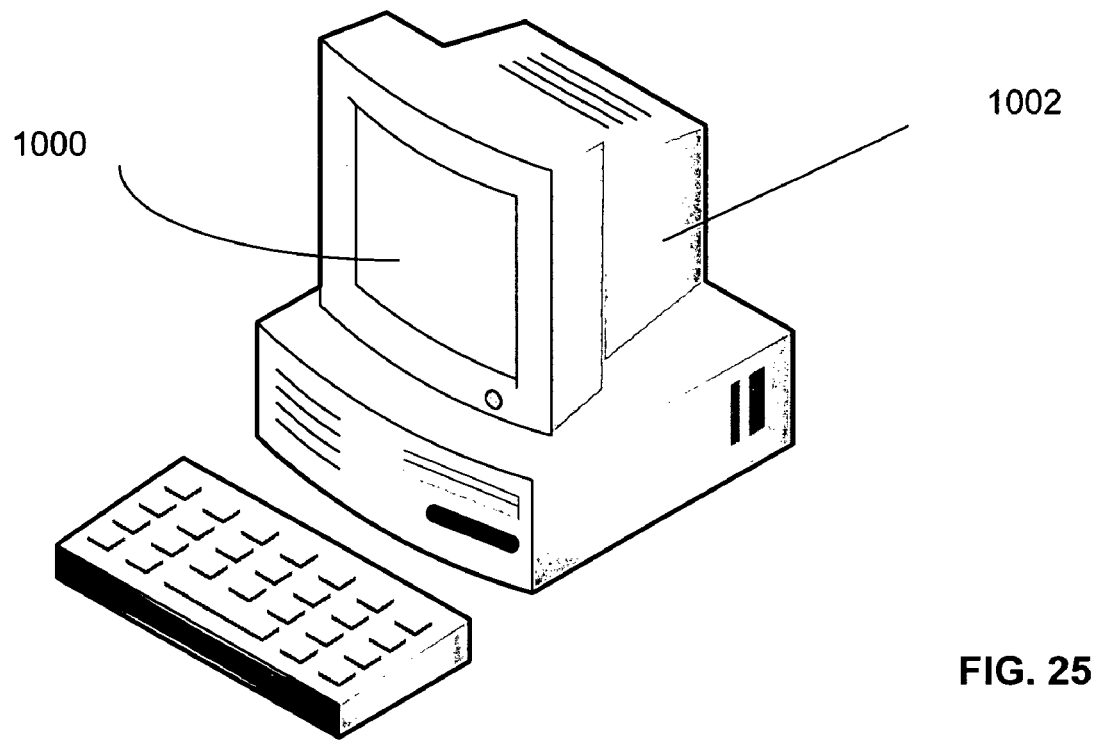
FIG. 25 depicts an embodiment used in a computer monitor.
Figure 26:
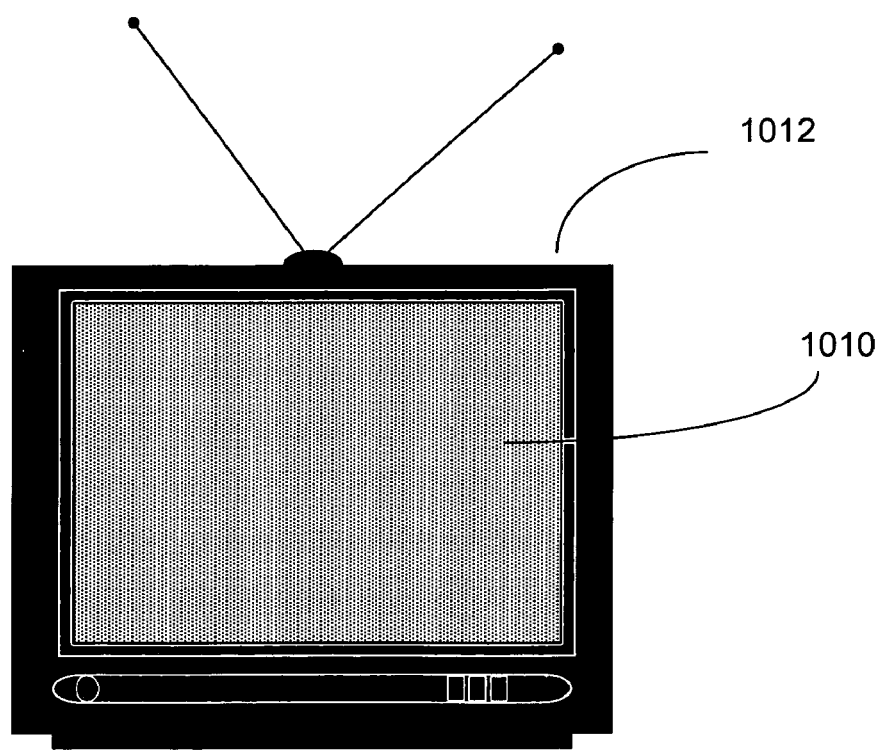
FIG. 26 depicts an embodiment used in a television screen.

Self-organizing and/or self-assembling display element arrays as disclosed herein may find application in a wide variety of devices and systems. For example, FIG. 25 depicts application of a self-assembling display element array 1000 in computer monitor 1002. As another example, FIG. 26 depicts application of a self-assembling display element array 1010 in a television screen 1012. It is increasingly the case that there is little distinction between television screens and computers monitors, as televisions include more interactive capabilities, and television screens include capabilities for displaying images in multiple windows, displaying menu options, and so forth.

Figure 27:
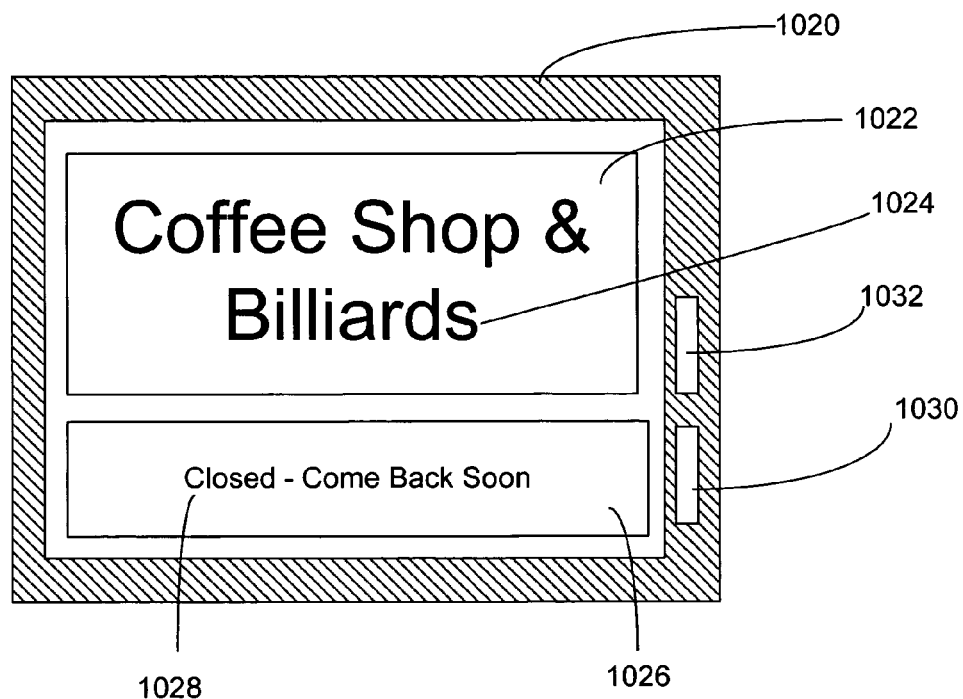
FIG. 27 depicts an embodiment used in an electronic sign.

FIG. 27 illustrates the use of self-assembled display element arrays on a sign 1020. The example presented in FIG. 27 includes a static display portion 1022 that may be configured to display a static image 1024 (in this case, the text "Coffee Shop & Billiards"), while dynamic display portion 1026 may be configured to display a message or image 1028 that may be changed at intervals. If desired, the dynamic display portion may display a continuously changing message or image (e.g., scrolling text or animated image). Static display portion 1022 and dynamic display portion 1026 may differ with regard to type and distribution of display elements, or with regard to the control signals used to control the display elements. Signs (and related displays, such as labels, advertisements, billboard, etc., which may also incorporate embodiments of the present invention) may be entirely static, entirely dynamic or mixed-modal, depending on their intended use. Sign 1020 may include battery 1030 and control circuitry 1032 mounted in or on sign 1020 for driving operation of static display portion 1022 and dynamic display portion 1024.

Figure 28:
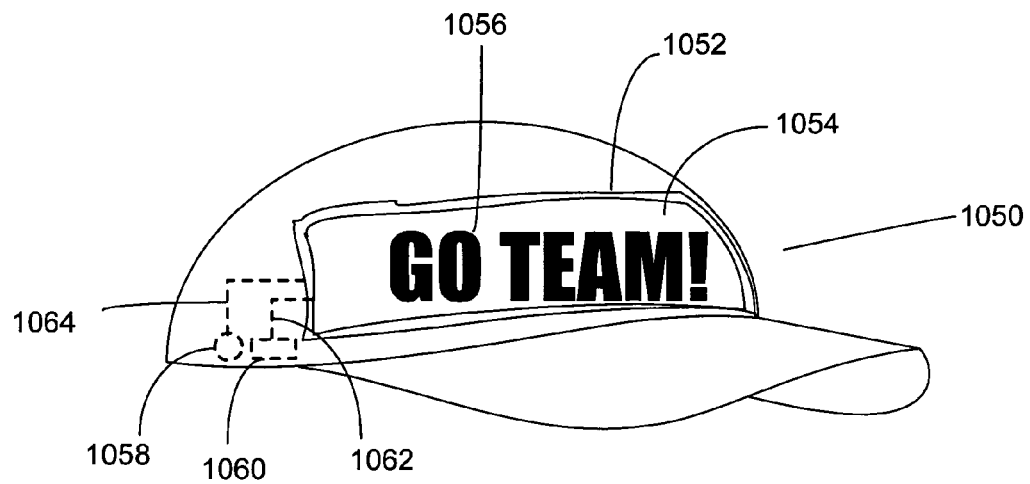
FIG. 28 depicts an embodiment used in an item of apparel.

Self-assembled display element arrays may also be used on items of apparel, or other decorative or functional items formed of flexible fabric or material. As an example, FIG. 28 illustrates the use of a self-assembled display element array on a baseball cap 1050. Baseball cap 1050 includes panel 1052 containing display element array 1054, which may be formed on a flexible substrate. Text, images, or patterns, which may be either static or dynamic, may be displayed on display element array 1054. In the example shown in FIG. 28, display element array 1054 displays text 1056, reading "GO TEAM!" Display element array 1054 may be powered by various methods. As shown in FIG. 28, a small battery 1058 may be mounted on cap 1050 in an inconspicuous location (e.g., in the interior of cap 1050) and connected to display element array 1054 via lead 1064. Alternative power supplies may be used instead, e.g., a solar cell. Controller 1060, which may be an ASIC- or a microprocessor-based device, may be mounted on cap 1050 and connected via one or more datalines 1062 to display element array 1054 to drive operation of display element array 1054.

Figure 29:
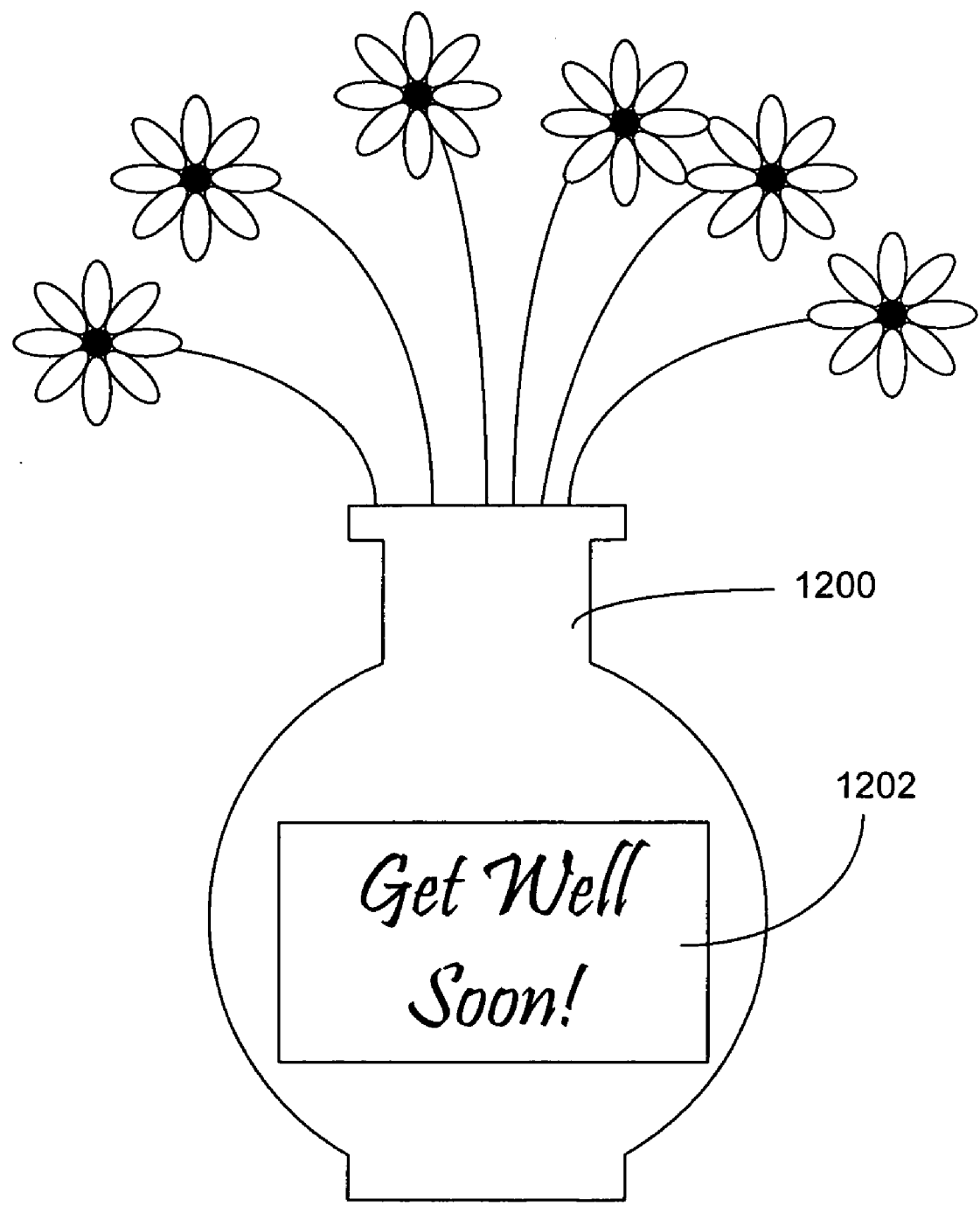
FIG. 29 depicts an embodiment used in a decorative object.

FIG. 29 illustrates the use of a self-assembled display element assembly on a decorative item having a non-planar substrate: in this example, a vase 1200 bearing a panel 1202 displaying the message "Get Well Soon!". The message "Get Well Soon!" may alternate with one or more other messages or images, may scroll across the panel, may flash, or may produce various other visual effects. Such variations of displays may be applied to any other embodiments in which a dynamic display element array is used, including but not limited to the examples presented herein. Vase 1200 may incorporate a battery or other power supply and control circuitry, as discussed in connection with the baseball cap embodiment depicted in FIG. 28.

Self-assembling display element arrays may be used in virtually any setting in which it is desired to graphically display static or dynamic text, images, or patterns on a surface. As discussed previously, dynamic displays may be varied at intervals (for example, dynamic display portion 1026 in FIG. 27 may be changed from "Closed—Come back Soon" to "Open—Come on In"), or may be varied continuously to display scrolling or flashing text, animated graphic, or various other dynamic displays as may be devised by those of skill in the relevant arts. Display elements may be of a wide range of sizes, and display element arrays or displays formed from such display elements may be of a wide range of sizes and resolutions, depending on intended application and construction method and materials. Text, images, and patterns formed through the use of such displays may be informative, decorative, or functional. Such displays may be used in or on a wide variety of decorative and/or functional items, to convey information or to change the appearance of an item in a functional manner (e.g., camouflage or visual signature-reduction on a vehicle or item of clothing), or to present a desired decorative appearance on various items (objects, items of apparel, etc., signs, labels, artwork.)

FIGS. 30A-30D illustrate the manufacture of a display having several regions containing self-assembled display element arrays of different types. In the example depicted in FIGS. 30A-30D, display 1300 includes a first display region 1302 on substrate 1301, which defines a face portion of a "smiley face". First display region 1302 may include a first type of receptor locations. Two eye portions 1306 and mouth portion 1308 may include a second type of receptor locations. Background region 1314, which forms a background to the smiley face, includes a third type of receptor locations. In FIG. 30B, a mixture of display elements 1318 is disposed on substrate 1301 from dispenser 1330. Mixture 1318 includes first, second and third display element types, 1320, 1322, and 1324, respectively, which are depicted in enlarged view in FIG. 30C. Mixture 1318 includes first, second and third display element types, 1320, 1322, and 1324, in quantities sufficient to fill respective receptor locations in first display region 1302, eye portions 1306, mouth portion 1308, and background region 1314. First display element type 1320, second display element types 1322, and third display element types 1324 may differ from each other in one or more characteristics. Following loading of display elements onto substrate 1301, the system may be agitated to cause the display elements to self-organize into their respective receptor locations. FIG. 30D illustrates display 1300 following assembly of display elements 1320 into their respective receptor locations in first display region 1302, display elements 1322 into their respective receptor locations in eye portions 1306 and mouth portion 1308, and display elements 1324 into their respective receptor locations in background region 1314.

Each display region may include receptor locations for a single type of display element, as depicted in FIGS. 30A-30D. For example, the first display region 1302 may include receptor locations for display elements of a first color (e.g., yellow), while the background regions may include receptor locations for display elements of a second color (e.g., blue). Alternatively, display regions may include receptor locations for multiple types of display elements, for example, the first display region 1302 may include receptor locations for orange and yellow display elements, while background region 1314 may include receptor locations for green and blue display elements. As another alternative, different regions of the display may include receptor locations for display elements of the same types in different proportions, for example, the first region may include one-third receptor locations for red display elements, one-third receptor locations for blue display elements, and one-third receptor locations for green display elements, while a second display region may include one-half receptor locations for red display elements, and one-quarter each of receptor locations for blue display elements and green display elements.

Display elements may differ by other characteristics than color, e.g., size, power consumption, spectral waveband, etc., and may differ by one or by multiple characteristics. The choice of display elements used in each region may be based on the text, pattern, or image that is to be displayed. If the display is intended to display a fixed pattern (e.g., the smiley face depicted in FIGS. 30A-30D), the display element characteristics may be selected to be suitable for the pattern. For example, the face portion of the smiley face may be yellow, and the background blue. The eyes and mouth portions may be black (in which case there may be no need to provide display elements that emit light in these portions). In the sign as depicted in FIG. 27, static display portion 1022 may include a first mixture of display elements suitable for displaying the intended static image or text, while the lower portion may include a different assortment of display elements, e.g., larger display elements in a single color, suitable for displaying the intended basic text but insufficient for displaying an image or more elaborate text.

Figure 31:
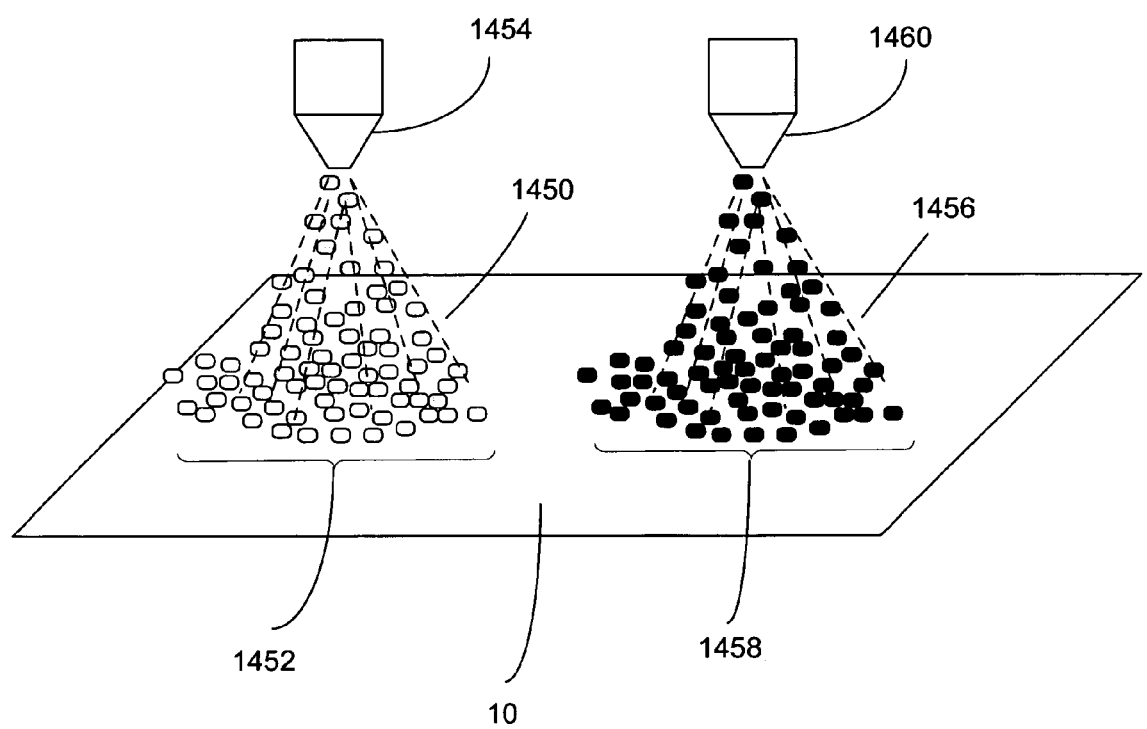
FIG. 31 illustrates distribution of display elements on several regions of a substrate.

FIG. 31 illustrates how display elements may be delivered to a substrate surface at two or more locations, by the use of multiple delivery devices. A first quantity of display elements 1450 is delivered to first location 1452 on substrate 10 from first delivery device 1454. A second quantity of display elements 1456 is delivered to second location 1458 on substrate 10 from second delivery device 1460. Substantially the same result could be obtained by using a single delivery device and moving the delivery device (which may be, for example, a nozzle, spout, inkjet, pressure jet, sprayer, etc.) with respect to the substrate, or moving the substrate with respect to the delivery device. By delivering different display elements (i.e., different types of display elements or mixtures of the same types of display elements in different proportions) at different locations, a spatially non-uniform distribution of display elements on the substrate may be obtained.

Figure 32A:
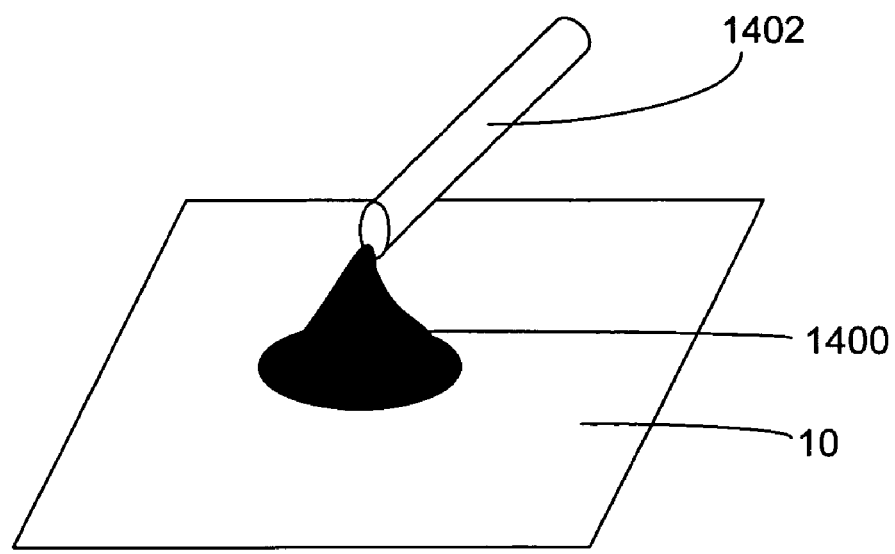
FIG. 32A-32B illustrate sequential distribution of display elements on a substrate.
Figure 32B:
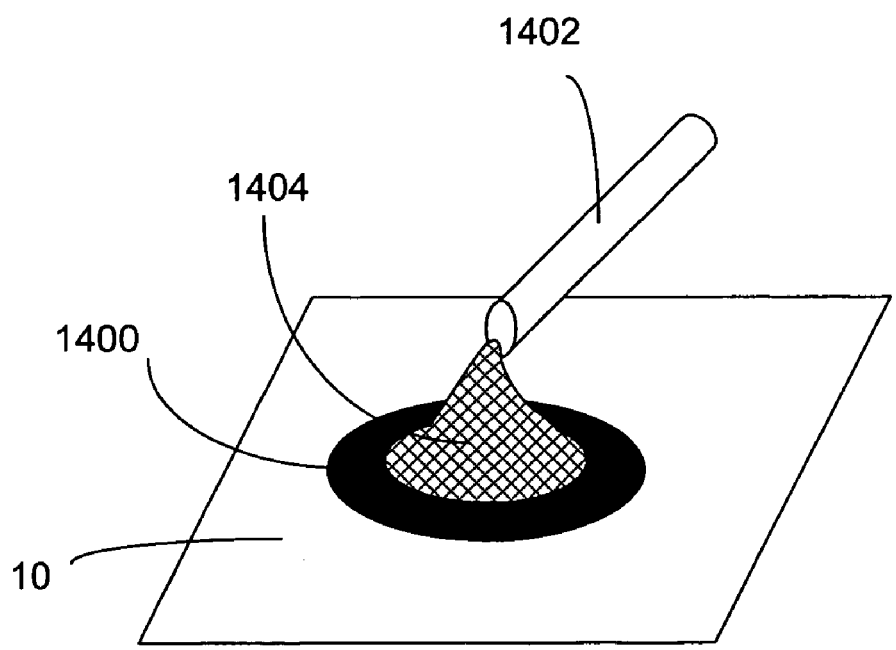

FIG. 32A and 32B illustrate a method of forming a non-uniform distribution of display elements on a substrate. In FIG. 32A, a first quantity of display elements 1400 (which may include a first mixture of display elements) is disposed onto substrate 10 from dispenser 1402 during a first time interval $t_1$. First quantity of display elements 1400 may have physical characteristics (size, shape, surface properties, density, etc.) that cause first quantity of display elements 1400 to spread out onto substrate 10 or may be in a mixture (e.g., with a liquid, gas or solid) that confers suitable spreading properties to first quantity of display elements 1400. In FIG. 32B, a second quantity (type or mixture) of display elements 1404 is disposed onto substrate 10 from dispenser 1402 during a second time interval $t_2$. Second quantity of display elements 1404 spreads out onto substrate 10, causing further outward spreading of first quantity of display elements 1400. The approach illustrated in FIGS. 32A and 32B exemplifies how a spatially non-uniform distribution of display elements on a substrate may be obtained by distributing different types or mixtures of display elements to the same location of a substrate at different times.

Figure 33A:
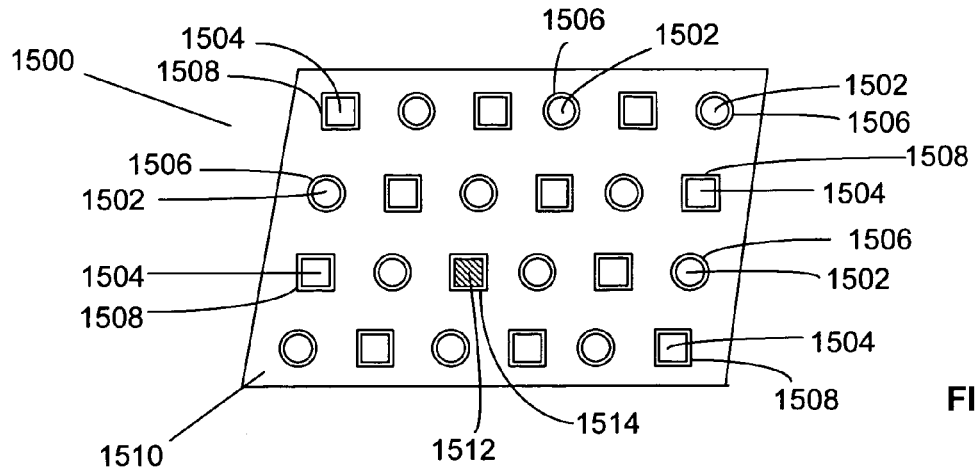
FIG. 33A-33C illustrate the replacement of a defective display element.
Figure 33B:
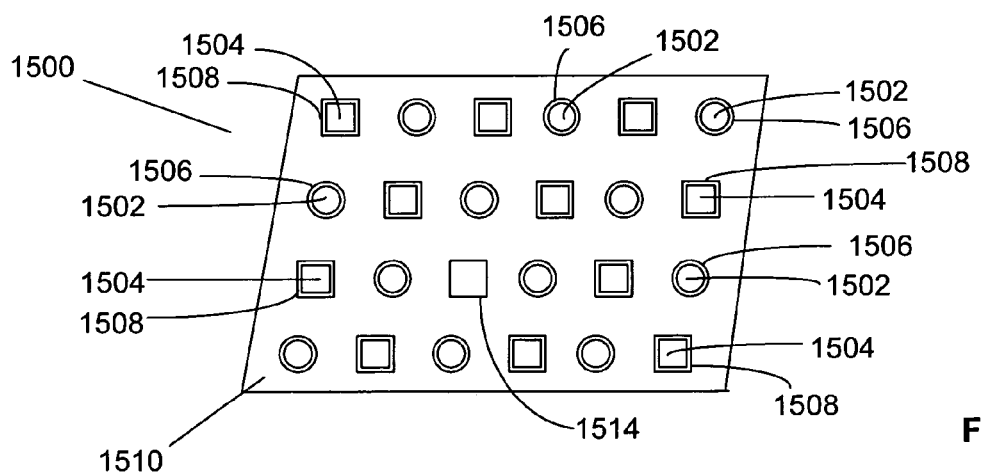
Figure 33C:
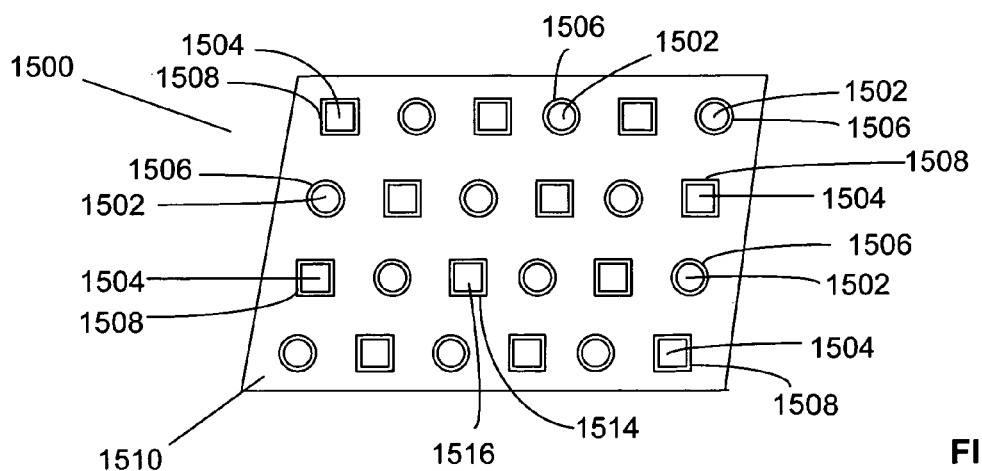

FIGS. 33A-33C illustrate a method of replacing defective or non-functional display elements. Display elements may be considered defective if they are partially or fully non-functional, functional but not connected properly, not positioned properly, or of the wrong type for the position in the array. The method may apply to single display elements or groups of display elements. The method may be used during the initial manufacture of the display element array, in connection with testing or troubleshooting, or may be adjusted for use post-manufacture, e.g., in the repair of damaged or worn out display element arrays. FIG. 33A illustrates display element array 1500, made up of two different types of display elements 1502 and 1504, assembled into receptor locations 1506 and 1508, respectively, on substrate 1510. Shaded display element 1512, assembled into receptor location 1514, is a defective display element of the same type as display elements 1504.

Non-functional display elements in a display may be detected by various methods, during and/or subsequent to the manufacture of the display. For example, a CCD camera may be used to detect activation of display elements. Display elements may be activated in a specified pattern; differences between the detected and expected pattern may indicate non-functional display elements. Activation of display elements may occur sequentially, simultaneously, or in any other pattern that is convenient for the particular display being tested. Different elements may be differentiated by time sequential activation and detection, color specific activation and detection, and so forth. Alternatively, activation of display elements may be determined by any signal that correlates with display element activation. For example, electrical correlates such as voltage drop or current may be measured as a means of determining activation of a display elements. Detection of electrical correlates may be performed with circuitry built into the display susbtrate or by separate test equipment.

FIG. 33B depicts display element array 1500 following removal of defective display element 1512 from receptor location 1514, leaving an empty receptor location 1514. Suitable methods for removing display elements from an assembled array will depend on the size and type of display elements, and will be known by those of skill in the art. In the case of small display elements, a moistened probe, for example, may be touched to the assembled array in the region of interest, and display elements may adhere to the probe by surface tension so they may be lifted from the assembled array. In other embodiments, adhesives, suction, magnetic forces, and various other forces may be used to lift a selected display element or group of display elements from a substrate. In some embodiments, defective display elements may be decoupled from their respective receptor locations prior to removal, through the use of heating, light, moisture, chemicals, electrical or magnetic fields, or various other methods, which will depend on the manner in which the display element(s) in question are held in place. In some embodiments, removal of display elements from a substrate may be possible only during initial manufacture steps, while in other embodiments removal of display elements from a substrate may be possible at various points after manufacture of the display.

Following removal of one of more defective display elements, empty receptor locations may be filled by replacement display elements by performing a procedure like that used initially to distribute display elements to receptor locations, e.g., as depicted and described in FIGS. 2-10. FIG. 33C illustrates display element array 1600 following a repair process. Receptor location 1514 in substrate 1510 has been filled by replacement display element 1516.

Figure 34:
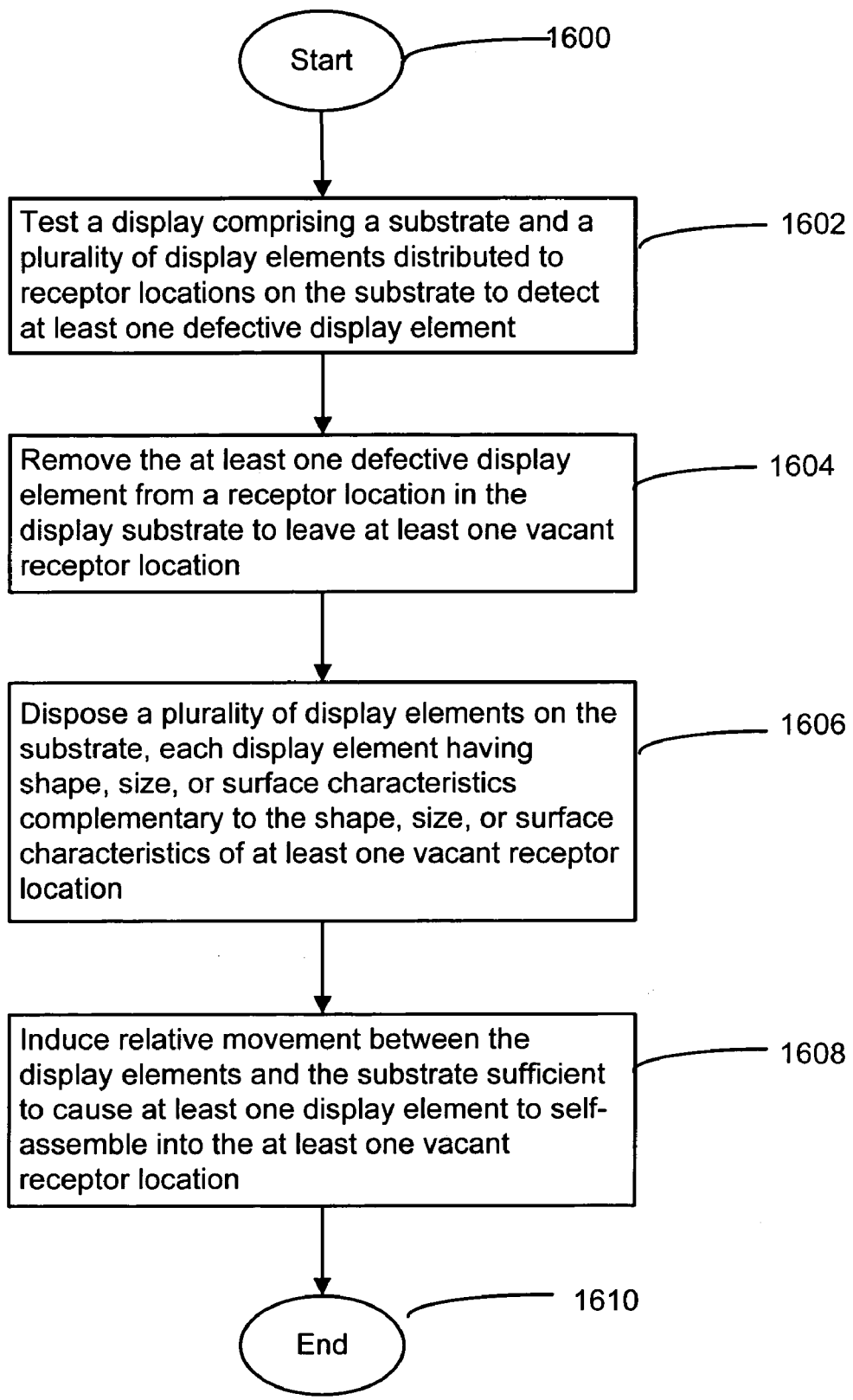
FIG. 34 shows a process for detecting and replacing a defective display element.

FIG. 34 outlines the steps of a method as illustrated in FIGS. 33A-33C. At step 1602, a display that includes a substrate and a plurality of display elements distributed to receptor locations on the substrate is tested to detect at least one defective display element. At step 1604, the defective display element is removed from a receptor location in the display substrate, to leave at least one vacant receptor location. At step 1606, a plurality of display elements are disposed on the substrate. Each display element may have shape, size, or surface characteristics complementary to the shape, size, or surface characteristics of at least one vacant receptor location. At step 1608, relative movement is induced between the display elements and the substrate sufficient to cause at least one display element to self assemble into the at least one vacant receptor location. Depending on the particular embodiment, following the self assembly process of step 1608, display elements may be secured sufficiently strongly to the substrate, or, in some embodiment, a further attachment step may be used to secure one or more display element in place at respective receptor locations.

With regard to the hardware and/or software used in the control of displays according to the present image, and particularly to the control of light generation by display elements within such displays, those having skill in the art will recognize that the state of the art has progressed to the point where there is little distinction left between hardware and software implementations of aspects of such systems; the use of hardware or software is generally (but not always, in that in certain contexts the choice between hardware and software can become significant) a design choice representing cost vs. efficiency or implementation convenience tradeoffs. Those having skill in the art will appreciate that there are various vehicles by which processes and/or systems described herein can be effected (e.g., hardware, software, and/or firmware), and that the preferred vehicle will vary with the context in which the processes are deployed. For example, if an implementer determines that speed and accuracy are paramount, the implementer may opt for a hardware and/or firmware vehicle; alternatively, if flexibility is paramount, the implementer may opt for a solely software implementation; or, yet again alternatively, the implementer may opt for some combination of hardware, software, and/or firmware. Hence, there are several possible vehicles by which the processes described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will require optically-oriented hardware, software, and or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be implicitly understood by those with skill in the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in standard integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the capabilities of one of skill in the art in light of this disclosure. In addition, those skilled in the art will appreciate that certain mechanisms of the subject matter described herein are capable of being distributed as a program product in a variety of forms, and that an illustrative embodiment of the subject matter described herein applies equally regardless of the particular type of signal bearing media used to actually carry out the distribution. Examples of a signal bearing media include, but are not limited to, the following: recordable type media such as floppy disks, hard disk drives, CD ROMs, digital tape, and computer memory; and transmission type media such as digital and analog communication links using TDM or IP based communication links (e.g., links carrying packetized data).

In a general sense, those skilled in the art will recognize that the various aspects described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general-purpose computing device configured by a computer program (e.g., a general-purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment).

Those skilled in the art will recognize that it is common within the art to describe devices for displaying or otherwise presenting information in the fashion set forth herein, and thereafter use standard engineering practices to integrate such described devices and/or processes into displays or other light-emitting or -modulating devices as exemplified herein. That is, at least a portion of the devices and/or processes described herein can be integrated into a display or other light-emitting or -modulating device containing system via a reasonable amount of experimentation.

Those having skill in the art will recognize that such systems generally include one or more of a memory such as volatile and non-volatile memory, processors such as microprocessors and digital signal processors, computational-supporting or -associated entities such as operating systems, user interfaces, drivers, sensors, actuators, applications programs, one or more interaction devices, such as data ports, control systems including feedback loops and control implementing actuators (e.g., devices for sensing position and/or velocity and/or acceleration or time-rate-of-change thereof; control motors or actuators for moving and/or adjusting components and/or quantities). A typical display system may be implemented utilizing any suitable available components, such as those typically found in appropriate computing/communication systems and/or light-emitting systems, combined with standard engineering practices.

The foregoing-described aspects depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected", or "operably coupled", to each other to achieve the desired functionality.

While particular aspects of the present subject matter described herein have been shown and described, it will be obvious to those skilled in the art that, based upon the teachings herein, changes and modifications may be made without departing from this subject matter described herein and its broader aspects and, therefore, the appended claims are to encompass within their scope all such changes and modifications as are within the true spirit and scope of this subject matter described herein. Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should NOT be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" and/or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense of one having skill in the art would understand the convention (e.g., "a system having at least one of A, B, and C" would include but not be limited to systems that have A alone, B alone, C alone, A and B together, A and C together, B and C together, and/or A, B, and C together). In those instances where a convention analogous to "at least one of A, B, or C, etc." is used, in general such a construction is intended in the sense of one having skill in the art would understand the convention (e.g., "a system having at least one of A, B, or C" would include but not be limited to systems that have A alone, B alone, C alone, A and B together, A and C together, B and C together, and/or A, B, and C together).

Although the methods, devices, systems and approaches herein have been described with reference to certain preferred embodiments, other embodiments are possible. As illustrated by the foregoing examples, various choices of display element and substrate configuration may be within the scope of the invention. As has been discussed, the choice of system configuration may depend on the intended application of the system, the environment in which the system is used, cost, personal preference or other factors. Display design, manufacture, and control processes may be modified to take into account choices of display element components and configuration, and such modifications, as known to those of skill in the arts of display design and construction, may fall within the scope of the invention. Therefore, the full spirit or scope of the invention is defined by the appended claims and is not to be limited to the specific embodiments described herein.

The invention claimed is:

1. A method of forming a display, comprising:
   a) introducing a first set of display elements, each having a first shape, size or surface characteristic and including a light-modulating element of a first type, onto a substrate;
   b) inducing relative motion in said display elements in said first set and said substrate sufficient to cause at least a portion of said display elements in said first set to distribute into a first plurality of receptacles on said substrate, said first plurality of receptacles having a first complementary shape, size or surface characteristic that is complementary to said first shape, size or surface characteristic;
   c) removing display elements in said first set that have not distributed into receptacles in said first plurality of receptacles;
   d) introducing a second set of display elements, having a second shape, size or surface characteristic and including a light-modulating element of a second type, onto said substrate;
   e) inducing relative motion in said display elements in said second set and said substrate sufficient to cause at least a portion of said display elements in said second set to distribute into a second plurality of receptacles on said substrate, said second plurality of receptacles having a second complementary shape, size or surface characteristic that is complementary to said second shape, size or surface characteristic;
   f) removing display elements in said second set that have not distributed into receptacles in said second plurality of receptacles;
   g) connecting display elements distributed into receptacles on said substrate to said substrate; and
   h) connecting display elements of said first set to said substrate prior to introducing said second set of display elements onto said substrate.

2. The method of claim 1, wherein display elements in said first set are configured to have a probability of fitting into receptacles complementary to said second shape, size or surface characteristic that is lower than the probability of display elements in said second set fitting into receptacles complementary to said first shape, size or surface characteristic.

3. The method of claim 1, wherein display elements having said first shape, size or surface characteristic are of a different size but substantially the same shape as display elements having said second shape, size or surface characteristic.

4. The method of claim 1, wherein display elements having said first shape, size or surface characteristic are of a different shape but substantially the same size as display elements having said second shape, size or surface characteristic.

5. The method of claim 1, wherein display elements having said first shape, size or surface characteristic are larger than display elements having said second shape, size or surface characteristic.

6. The method of claim 1, wherein display elements having said first shape, size or surface characteristic have a different surface characteristic but are substantially the same shape and size as display elements having said second shape, size or surface characteristic.

7. The method of claim 1, including assisting distribution of a display element of at least one of said first set and said second set into a complementary receptacle on said substrate by at least one of gravity, generation of a body force in the assembly of display elements, bulk acceleration of the display elements, attraction between a display element surface and the interior of a receptacle complementary to said display element, and repulsion of a display element surface from a substrate surface external to said receptacle.

8. The method of claim 1, including recovering display elements removed from said substrate for later use.

9. The method of claim 1, including connecting display elements to said substrate by making electrical, magnetic, acoustic or optical connections between said display elements and said substrate.

10. The method of claim 1, including connecting display elements to adjacent display elements.

11. The method of claim 10, including connecting display elements to adjacent display elements by forming electrical, magnetic, acoustic or optical connections between said display elements and said substrate.

12. The method of claim 1, including determining a unique identifier including address information for each said display element following connection of said display element to said substrate through at least one of using circuitry on said display element or using circuitry external to said display element subsequently storing said address information in said display element.

13. The method of claim 1, wherein introducing display elements in at least one of said first set and said second set includes at least one of spraying said display elements onto said substrate or disposing said display elements onto said substrate in a fluidized medium, a slurry, an emulsion, a suspension, a colloid or a gel.

* * * * *

UNITED STATES PATENT AND TRADEMARK OFFICE
CERTIFICATE OF CORRECTION

PATENT NO. : 7,662,008 B2 Page 1 of 1
APPLICATION NO. : 11/099682
DATED : February 16, 2010
INVENTOR(S) : Hillis et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1191 days.

Signed and Sealed this

Twenty-eighth Day of December, 2010

David J. Kappos
*Director of the United States Patent and Trademark Office*